(12) United States Patent
Kunita

(10) Patent No.: US 6,858,373 B2
(45) Date of Patent: Feb. 22, 2005

(54) PHOTOSENSITIVE COMPOSITION AND NEGATIVE WORKING LITHOGRAPHIC PRINTING PLATE

(75) Inventor: Kazuto Kunita, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 105 days.

(21) Appl. No.: 10/106,326

(22) Filed: Mar. 27, 2002

(65) Prior Publication Data

US 2003/0091933 A1 May 15, 2003

(30) Foreign Application Priority Data

Apr. 13, 2001 (JP) .................................. P.2001-115598

(51) Int. Cl.[7] .............................................. G03F 7/027
(52) U.S. Cl. ............................. 430/281.1; 430/282.1; 430/283.1; 430/284.1; 430/285.2; 430/286.1; 430/287.1; 430/494; 430/944; 430/945; 430/964
(58) Field of Search .................... 430/270.1, 281.1, 430/282.1, 293.1, 284.1, 285.1, 286.1, 287.1, 302, 494, 944, 945, 964

(56) References Cited

U.S. PATENT DOCUMENTS

| | | | | |
|---|---|---|---|---|
| 5,691,114 A | * | 11/1997 | Burberry et al. | 430/302 |
| 5,759,742 A | * | 6/1998 | West et al. | 430/278.1 |
| 6,476,092 B1 | * | 11/2002 | Kunita | 522/31 |
| 6,551,757 B1 | * | 4/2003 | Bailey et al. | 430/270.1 |
| 6,716,565 B2 | * | 4/2004 | Kunita et al. | 430/270.1 |
| 2001/0054363 A1 | * | 12/2001 | Nakazawa et al. | 101/465 |
| 2003/0008996 A1 | * | 1/2003 | Kunita | 526/297 |
| 2003/0084806 A1 | * | 5/2003 | Kunita et al. | 101/453 |

* cited by examiner

Primary Examiner—Barbara L. Gilliam
(74) Attorney, Agent, or Firm—Burns, Doane, Swecker & Mathis, L.L.P.

(57) ABSTRACT

A photosensitive composition comprising a resin containing a repeating unit corresponding to a monomer having a structure represented by formula (I) defined in the specification, and a negative working lithographic printing plate having a negative working photosensitive layer comprising the above-described photosensitive composition.

18 Claims, No Drawings

PHOTOSENSITIVE COMPOSITION AND NEGATIVE WORKING LITHOGRAPHIC PRINTING PLATE

FIELD OF THE INVENTION

The present invention relates to a photosensitive composition suitable for use in the productions of lithographic printing plates, integrated circuits and photomasks, and a negative working lithographic printing plate. In particular, it relates to a photo-crosslinkable photosensitive composition suitable for use in the preparation of a lithographic printing plate precursor that is capable of being subjected to a so-called direct plate-making, in which the plate-making is directly conducted based on digital signals, for example, from a computer using various kinds of lasers, and also relates to a negative working lithographic printing plate.

BACKGROUND OF THE INVENTION

A solid laser, semiconductor laser and gas laser having a large output and a small size, which radiate an ultraviolet ray, visible light or infrared ray having a wavelength of from 300 to 1,200 nm, have become easily available, and these lasers are very advantageous for a recording light source used in the direct plate-making based on digital signals, for example, from a computer.

Various investigations on recording materials sensitive to such laser beams have been made. Representative examples of the recording materials include first recording materials capable of being recorded with a infrared laser having a wavelength of not less than 760 nm, for example, positive working recording materials as described in U.S. Pat. No. 4,708,925 and negative working recording materials of acid catalyst crosslinking type described in JP-A-8-276558 (the term "JP-A" as used herein means an "unexamined published Japanese patent application"), and second recording materials responsive to an ultraviolet ray or visible light laser having a wavelength of from 300 to 700 nm, for example, negative working recording materials of radical polymerization type as described in U.S. Pat. No. 2,850,445 and JP-B-44-20189 (the term "JP-B" as used herein means an "examined Japanese patent publication").

On the other hand, recording materials responsive to light having a short wavelength of not more than 300 nm are especially important for photoresist materials. In recent years, the degree of integration is more and more increased in integrated circuits, and the fabrication of super-fine patterns composed of lines having a width of finer than a half micron has been required in the production of semiconductor substrate, for example, VLSI. In order to fulfill such requirements, the wavelength of light source for an exposure apparatus used in photolithography is more and more shortened and the use of a far ultraviolet ray or an excimer laser (e.g., XeCl, KrF or ArF) has been investigated. Further, the formation of super-fine patterns by an electron beam has been started to investigate. Particularly, the electron beam is regarded as a promising light source for the next generation pattern formation techniques.

A subject common to all of these image recording materials is how a film strength of a photosensitive layer and preservation stability can be stood together.

The recording material for lithographic printing plate is required to have a high film strength in view of printing durability. However, it is difficult for the film strength of a photosensitive layer to consist with the preservation stability, and satisfactory results thereon have not been obtained in the prior art. Thus, novel techniques to solve the problem have been desired.

SUMMARY OF THE INVENTION

Therefore, an object of the present invention is to provide a photosensitive composition and a negative working lithographic printing plate excellent in both the film strength of a photosensitive layer and the preservation stability in a photo-crosslinking composition that is promising in image forming techniques from the standpoint of the strength of photosensitive layer.

Another object of the present invention is to provide a photosensitive composition capable of forming a lithographic printing plate precursor excellent in the printing durability of a photosensitive layer and the preservation stability, which is suitable for a lithographic printing plate precursor capable of performing the direct plate-making based on digital data, for example, from a computer by recording with a laser beam radiating an ultraviolet ray, visible light or infrared ray and a negative working lithographic printing plate.

Other objects of the present invention will become apparent from the following description.

As a result of the earnest investigations, it has been found that the above-described objects of the present invention can be achieved by using a polymer obtained by polymerization of a specific monomer in a photosensitive composition.

Specifically, the present invention includes the following photosensitive composition and negative working lithographic printing plate:

(1) A photosensitive composition comprising a resin containing a repeating unit corresponding to a monomer having a structure represented by the following formula (I):

wherein $Q^1$ represents a cyano group (CN) or a group represented by $COX^2$; $X^1$ and $X^2$ each represents a halogen atom or a group connected through a hetero atom; $R^a$ and $R^b$, which may be the same or different, each represents a hydrogen atom, a halogen atom, a cyano group or an organic residue; or $X^1$ and $X^2$, $R^a$ and $R^b$ or $X^1$ and $R^a$ or $R^b$ may combine with each other to form a cyclic structure;

(2) A negative working lithographic printing plate having a negative working photosensitive layer comprising the photosensitive composition as described in item (1) above.

DETAILED DESCRIPTION OF THE INVENTION

In order for a lithographic printing plate to have good printing durability, the image area is required to have a high strength in the lithographic printing plate. For such a purpose, it is important to increase a molecular weight of a binder used. Acrylic or methacrylic polymers of a high polymerization degree are ordinarily used for achieving the purpose. However, when such a polymer is employed as a binder of a photosensitive composition, compatibility of the polymer with other crosslinking components tends to deteriorate as the increase in their molecular weight. As a result, a problem of the preservation stability in that the photosensitive composition is separated during storage may apt to occur.

On the other hand, compounds (monomers) having an α-hetero-substituted methylacryl group as a group having polymerizability comparing favorably with the acrylic groups are known. It has been found that a polymer derived from such a compound exhibits good compatibility with other crosslinking components, good preservation stability and high strength in the image area.

Although the reasons for achieving these properties are not completely clear, it is believed that due to the pendant α-hetero-substituted methyl groups on the polymer main chain, a self-aggregation ability of the polymer sterically decreases and at the same time, a chemical interaction of the α-hetero substituent with other crosslinking components is strengthened, thereby increasing the compatibility. Also, the uniform dispersion of crosslinking component easily causes a crosslinking reaction with the binder to increase efficiency of the crosslinking reaction at the time of exposure, whereby the film strength in the image area is increased.

A negative working lithographic printing plate using the photosensitive composition according to the present invention is capable of forming an image by laser exposure. Specifically, the negative working lithographic printing plate is suitable for a lithographic printing plate precursor capable of performing direct plate-making based on digital data, for example, from a computer by recording with a laser radiating an ultraviolet ray, visible light or infrared ray. The photosensitive lithographic printing plate exhibits a high film strength in the image area of photosensitive layer and is excellent in printing durability and preservation stability. The photosensitive composition according to the present invention has the extremely high practicality.

<Polymer Obtained by Polymerization of a Monomer Having a Structure Represented by Formula (I)>

The polymer for use in the present invention is a polymer obtained by polymerization of the monomer having a structure represented by formula (I). More specifically, it is a polymer prepared by polymerization through the unsaturated double bond adjacent to $Q^1$ in formula (I).

The monomer having a structure represented by formula (I) according to the present invention is described in detail below.

The structure represented by formula (I) may form a monovalent substituent, or a compound in which all of $R^a$, $R^b$, $X^1$ and $X^2$ in formula (I) each represents a terminal group.

In formula (1), $Q^1$ represents a cyano group (—CN) or a group represented by formula —$COX^2$.

$X^1$ and $X^2$ each represents a halogen atom or a group connected through a hetero atom, and may be a terminal group or a connecting group bonding to another substituent.

The hetero atom is preferably a non-metallic atom, and specifically includes an oxygen atom, a sulfur atom, a nitrogen atom and a phosphorus atom. The halogen atom include, for example, a chlorine atom, a bromine atom, an iodine atom and a fluorine atom.

$X^1$ is preferably a halogen atom or as the connecting group bonding to another substituent, a hydroxy group, a substituted oxy group, a mercapto group, a substituted thio group, an amino group, a substituted amino group, a sulfo group, a sulfonato group, a substituted sulfinyl group, a substituted sultonyl group, a phosphono group, a substituted phosphono group, a phosphonato group, a substituted phosphonato group, a nitro group or a heterocyclic group that is connected through a hetero atom included therein.

$X^2$ is preferably a halogen atom or as the connecting group bonding to another substituent, a hydroxy group, a substituted oxy group, a mercapto group, a substituted thio group, an amino group, a substituted amino group or a heterocyclic group that is connected through a hetero atom included therein.

Alternatively, $X^1$ and $X^2$ may combine with each other to form a ring.

$R^a$ and $R^b$, which may be the same or different, each represents preferably a hydrogen atom, a halogen atom, a no cyano group or as the organic residue, a hydrocarbon group which may have a substituent and/or an unsaturated bond, a substituted oxy group, a substituted thio group, a substituted amino group, a substituted carbonyl group or a carboxylato group. Alternatively, $R^a$ and $R^b$ may combine with each other to form a cyclic structure.

Each of the substituents in $X^1$, $X^2$, $R^a$ and $R^b$ in formula (I) is described below.

The hydrocarbon group which may have a substituent and/or an unsaturated bond includes an alkyl group, a substituted alkyl group, an aryl group, a substituted aryl group, an alkenyl group, a substituted alkenyl group an alkynyl group and a substituted alkynyl group.

The alkyl group includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The substituted alkyl group is composed of a substituent bonding to an alkylene group. The substituent includes a monovalent non-metallic atomic group exclusive of a hydrogen atom. Preferred examples of the substituent for the alkyl group include a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof (hereinafter, referred to as a carboxylato group), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($-SO_3H$) and a conjugate base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-alkylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group ($-SO_2NHSO_2(alkyl)$) and a conjugate base group thereof, an N-arylsulfonylsulfamoyl group ($-SO_2NHSO_2(aryl)$) and a conjugate base group thereof, an N-alkylsulfonylcarbamoyl group ($-CONHSO_2(alkyl)$) and a conjugate base group thereof, an N-arylsulfonylcarbamoyl group ($-CONHSO_2(aryl)$) and a conjugate base group thereof, an alkoxysilyl group ($-Si(O-alkyl)_3$), an aryloxysilyl group ($-Si(O-aryl)_3$), a hydroxysilyl group ($-Si(OH)_3$) and a conjugate base group thereof, a phosphono group ($-PO_3H_2$) and a conjugate base group thereof (hereinafter, referred to as a phosphonato group), a dialkylphosphono group ($-PO_3(alkyl)_2$), a diarylphosphono group ($-PO_3(aryl)_2$), an alkylarylphosphono group ($-PO_3(alkyl)(aryl)$), a monoalkylphosphono group ($-PO_3H(alkyl)$) and a conjugate base group thereof (hereinafter, referred to as an alkylphosphonato group), a monoarylphosphono group ($-PO_3H(aryl)$) and a conjugate base group thereof (hereinafter, referred to as an arylphosphonato group), a phosphonoxy group ($-OPO_3H_2$) and a conjugate base group thereof (hereinafter, referred to as a phosphonatoxy group), a dialkylphosphonoxy group ($-OPO_3(alkyl)_2$), a diarylphosphonoxy group ($-OPO_3(aryl)_2$), an alkylarylphosphonoxy group ($-OPO_3(alkyl)(aryl)$), a monoalkylphosphonoxy group ($-OPO_3H(alkyl)$) and a conjugate base group thereof (hereinafter, referred to as an alkylphosphonatoxy group), a monoarylphosphonoxy group ($-OPO_3H(aryl)$) and a conjugate base group thereof (hereinafter, referred to as an arylphosphonatoxy group), a cyano group, a nitro group, an aryl group, an alkenyl group and an alkynyl group.

Specific examples of the alkyl group in the substituents include those described above. Specific examples of the aryl group in the substituents include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxphenyl, phenoxyphenyl, acetoxyphenyl, benzoyloxyphenyl, methylthiophenyl, phenylthiophenyl, methylaminophenyl, dimethylaminophenyl, acetylaminophenyl, caroxphenyl, methoxycarbonylphenyl, ethoxycarbonylphenyl, phenoxycarbonhylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group include vinyl, 1-propenyl, 1-butenyl, cinnamyl and 2-chloro-1-ethenyl groups. Specific examples of the alkenyl group include ethynyl, 1-propynyl, 1-butynyl, trimethylsilylethynyl and phenylethynyl groups.

In the acyl group ($R^4CO-$) described above, $R^4$ represents a hydrogen atom, or the above-described alkyl group, aryl group, alkenyl group or alkynyl group.

In the substituted alkyl group, the alkylene group includes a divalent organic residue obtained by eliminating any one of hydrogen atoms on the alkyl group having from 1 to 20 carbon atoms described above, and preferably a straight chain alkylene group having from 1 to 12 carbon atoms, a branched alkylene group having from 3 to 12 carbon atoms and a cyclic alkylene group having from 5 to 10 carbon atoms. Specific preferred examples of the substituted alkyl group chloromethyl, bromomethyl, 2-chloroethyl, trifluoromethyl, methoxymethyl, methoxyethoxyethyl, allyloxymethyl, phenoxymethyl, methylthiomethyl, tolythiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylburyl, ethoxycarbonylethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, $CH_3CONHSO_2CH_2CH_2CH_2CH_2-$,

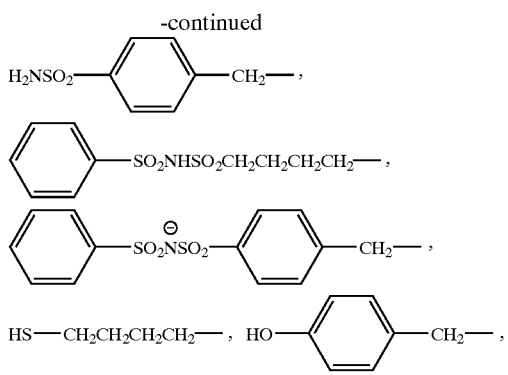

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups.

The aryl group includes a condensed ring of one to three benzene rings and a condensed ring of a benzene ring and a 5-membered unsaturated ring. Specific examples of the aryl group include phenyl, naphthyl, anthryl, phenanthryl, indenyl acenaphthenyl and fluorenyl groups. A phenyl group and a naphthyl group are preferred.

The substituted aryl group is a group formed by bonding a substituent to an aryl group and includes groups having a monovalent non-metallic atomic group exclusive of a hydrogen atom, as a substituent, on the ring-forming carbon atoms of the above-described aryl group. Examples of the substituent include the above-described alkyl and substituted alkyl group and the substituents for the substituted alkyl group. Specific preferred examples of the substituted aryl group include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl) sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups.

The alkenyl group includes that described above. The substituted alkenyl group is a group formed by replacing a hydrogen atom of the alkenyl group with a substituent. Examples of the substituent include the substituents for the substituted alkyl group described above, and the alkenyl group is that described above. Preferred examples of the substituted alkenyl group include the following groups:

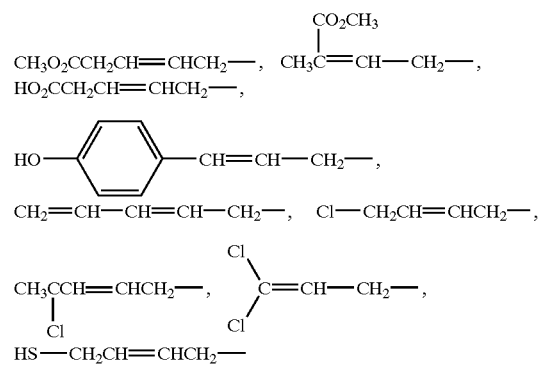

The alkynyl group includes that described above. The substituted alkynyl group is a group formed by replacing a hydrogen atom of the alkynyl group with a substituent. Examples of the substituent include the substituents for the substituted alkyl group described above, and the alkynyl group is that described above.

The heterocyclic group includes a monovalent group formed by eliminating one hydrogen atom on the hetero ring and a monovalent group (a substituted heterocyclic group) formed by further eliminating one hydrogen atom from the above-described monovalent group and bonding a substituent selected from the substituents for the substituted alkyl group described above. Preferred examples of the hetero ring are set forth below.

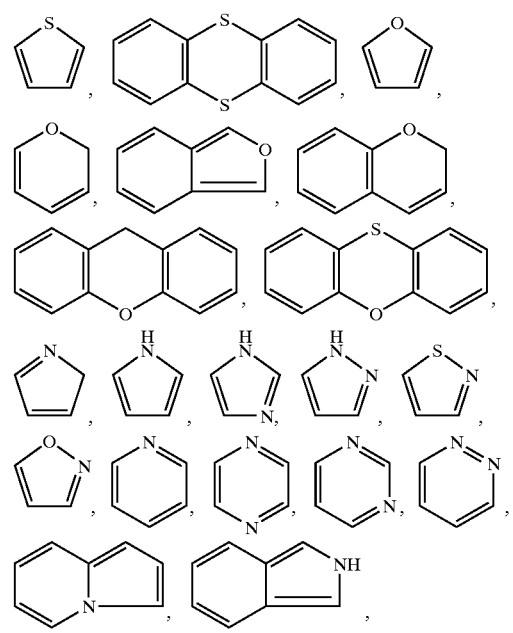

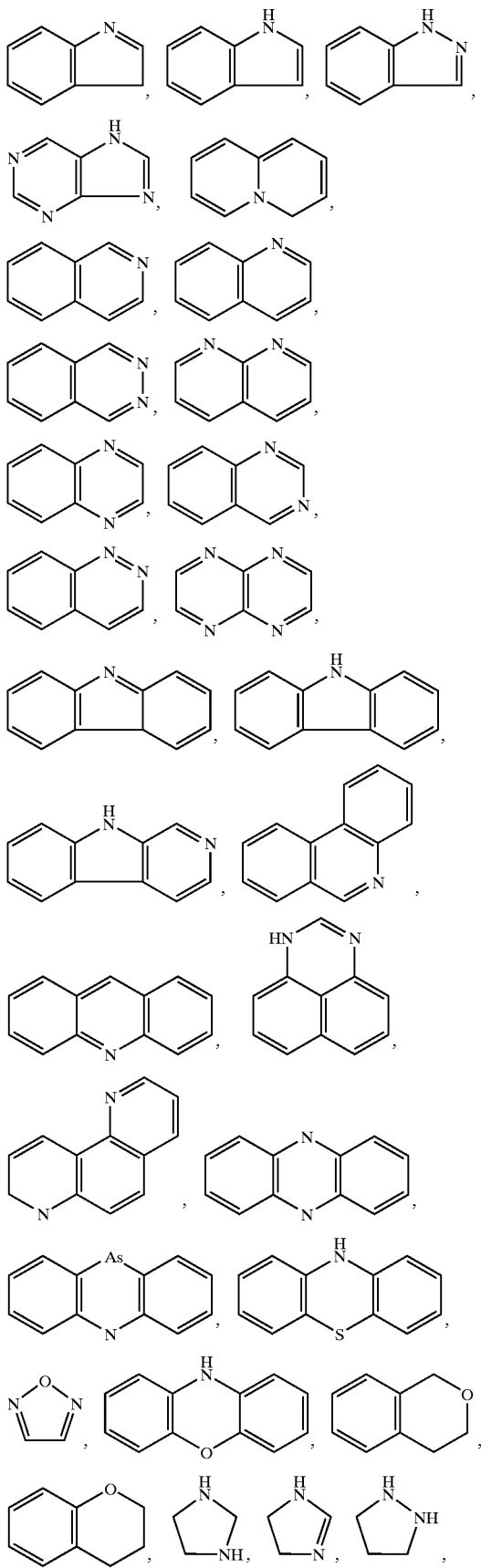
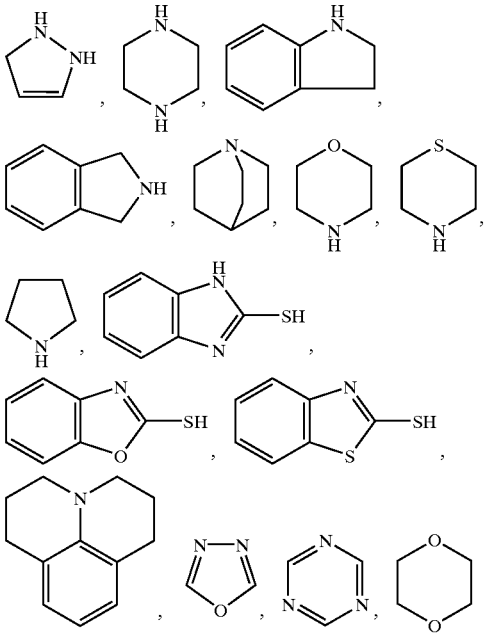

In the substituted oxy group ($R^5O—$) described above, $R^5$ represents a monovalent non-metallic atomic group excusive of a hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and aryl group in the above-described substituted oxy group include those described for the alkyl group, substituted alkyl group, aryl group and substituted aryl group above. In an acyl group ($R^6CO—$) in the acyloxy group described above, $R^6$ represents the alkyl group, substituted alkyl group, aryl group and substituted aryl group described above. Of the substituted oxy groups, an alkoxy group, an aryloxy group, an acyloxy group and an arylsulfoxy group are more preferred. Specific preferred examples of the substituted oxy group include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonatoxy groups.

In the substituted thio group ($R^7S—$) described above, $R^7$ represents a monovalent non-metallic atomic group excusive of a hydrogen atom. Preferred examples of the substituted thio group include an alkylthio group, an arylthio group, an alkyldithio group, an aryldithio group and an acylthio group. The alkyl group and aryl group in the above-described substituted thio group include those described for the alkyl group, substituted alkyl group, aryl group and substituted aryl group above. In an acyl group ($R^6CO$—) in the acylthio group described above, $R^6$ has the same meaning as described above. Of the substituted thio groups, an alkylthio group and an arylthio group are more preferred. Specific preferred examples of the substituted thio group include methylthio, ethylthio, phenylthio, ethoxyethylthio, carboxyethylthio and methoxycarbonylthio groups.

In the substituted amino group ($R^8NH$— or ($R^9$)($R^{10}$)N—) described above, $R^8$, $R^9$ and $R^{10}$ each represents a monovalent non-metallic atomic group excusive of a hydrogen atom. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and aryl group in the above-described substituted amino group include those described for the alkyl group, substituted alkyl group, aryl group and substituted aryl group above. In an acyl group ($R^6CO$—) in the acylamino group, N-alkylacylamino group or N-arylacylamino group described above, $R^6$ has the same meaning as described above. Of the substituted amino groups, an N-alkylamino group, an N,N-dialkylamino group, an N-arylamino group and an acylamino group are more preferred. Specific preferred examples of the substituted amino group include methylamino, ethylamino, diethylamino, morpholino, piperidino, pyrrolidino, phenylamino, benzoylamino and acetylamino groups.

In the substituted carbonyl group ($R^{11}$—CO—) described above, $R^{11}$ represents a monovalent non-metallic atomic group excusive of a hydrogen atom. Preferred examples of the substituted carbonyl group include a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and aryl group in the above-described substituted carbonyl group include those described for the alkyl group, substituted alkyl group, aryl group and substituted aryl group above. Of the substituted carbonyl groups, a formyl group, an acyl group, a carboxy group, an alkoxycarbonyl group, an aryloxycarbonyl group, a carbamoyl group, an N-alkylcarbamoyl group, an N,N-dialkylcarbamoyl group and an N-arylcarbamoyl group are more preferred, and a formyl group, an acyl group, an alkoxycarbonyl group and an aryloxycarbonyl group are still more preferred. Specific preferred examples of the substituted carbonyl group include formyl, acetyl, benzoyl, carboxy, methoxycarbonyl, allyloxycarbonyl, N-methylcarbamoyl, N-phenylcarbamoyl, N,N-diethylcarbamoyl and morpholinocarbonyl groups.

In the substituted sulfinyl group ($R^{12}$—SO—) described above, $R^{12}$ represents a monovalent non-metallic atomic group excusive of a hydrogen atom. Preferred examples of the substituted sulfinyl group include an alkylsulfinyl group, an arylsulfinyl group, a sulfinamoyl group, an N-alkyl sulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and aryl group in the above-described substituted sulfinyl group include those described for the alkyl group, substituted alkyl group, aryl group and substituted aryl group above. Of the substituted sulfinyl groups, an alkylsulfinyl group and an arylsulfinyl group are more preferred. Specific examples of the substituted sulfinyl group include hexylsulfinyl, benzylsulfinyl and tolylsulfinyl groups.

In the substituted sulfonyl group ($R^{13}$—$SO_2$—) described above, $R^{13}$ represents a monovalent non-metallic atomic group excusive of a hydrogen atom. Preferred examples of the substituted sulfonyl group include an alkylsulfonyl group and an arylsulfonyl group. The alkyl group and aryl group in the above-described substituted sulfonyl group include those described for the alkyl group, substituted alkyl group, aryl group and substituted aryl group above. Specific examples of the substituted sulfonyl group include butylsulfonyl and chlorophenylsulfonyl groups.

The sulfonato group (—$SO_3^-$) described above means a conjugate base anion group of a sulfo group (—$SO_3H$) as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

The carboxylato group (—$CO_2$) described above means a conjugate base anion group of a carboxy group (—$CO_2H$) as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

The substituted phosphono group described above means a group formed by substituting one or two hydroxy groups of a phosphono group with one or two other organic oxy groups. Preferred examples of the substituted phosphono group include a dialkylphosphono group, a diarylphosphono group, an alkylarylphosphono group, a monoalkylphosphono group and a monoarylphosphono group as described above. Of the substituted phosphono groups, a dialkylphosphono group and a diarylphosphono group are more preferred. Specific examples of the substituted phosphono group include diethylphosphono, dibutylphosphono and diphenylphosphono groups.

The phosphonato group (—PO$_3^{2-}$ or —PO$_3$H$^-$) described above means a conjugate base anion group of a phosphono group (—PO$_3$H$_2$) resulting from primary acid dissociation or secondary acid dissociation as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., Na$^+$, K$^+$, Ca$^{2+}$ or Zn$^{2+}$).

The substituted phosphonato group described above means a conjugate base anion group of a group formed by substituting one hydroxy group of a phosphono group with another organic oxy group. Specific examples of the substituted phosphonato group include a conjugate base group of a monoalkylphosphono group (—PO$_3$H(alkyl)) and a conjugate base group of a monoarylphosphono group (—PO$_3$H(aryl)). Ordinarily, it is preferred to use together with a counter cation. Examples of the counter cation include those conventionally known, for example, various oniums (e.g., ammonium, sulfonium, phosphonium iodonium or azinium) and metal ions (e.g., Na$^+$, K$^+$, Ca$^{2+}$ or Zn$^{2+}$).

Now, the cyclic structure formed by combining X$^1$ and X$^2$, R$^a$ and R$^b$, or X$^1$ and R$^a$ or R$^b$ with each other is described below. An aliphatic ring formed by combining X$^1$ and X$^2$, R$^a$ and R$^b$, or X$^1$ and R$^a$ or R$^b$ with each other includes a 5-membered, 6-membered, 7-membered and 8-membered aliphatic rings, and preferably a 5-membered and 6-membered aliphatic rings. The aliphatic ring may have one or more substituents (examples thereof include the substituents for the substituted alkyl group described above) on one or more carbon atoms forming the ring. Also, a part of the aliphatic ring-forming carbon atoms may be replaced by hetero atom(s) (examples thereof include an oxygen atom, a sulfur atom and a nitrogen atom). Further, a part of the aliphatic ring may also form a part of an aromatic ring.

Specific examples of the monomer having a structure represented by formula (I) are set forth below, but the present invention should not be construed as being limited thereto.

TABLE 1

Group A

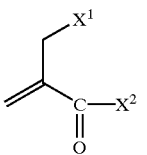

| No. | X$^1$ | X$^2$ |
|---|---|---|
| A-1 | OH | OCH$_3$ |
| A-2 | OH | O(n)C$_4$H$_9$ |
| A-3 | OH | O(n)C$_12$H$_{25}$ |
| A-4 | OH | 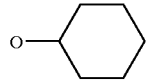 |
| A-5 | OH | 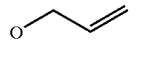 |
| A-6 | OH | 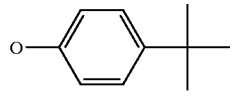 |
| A-7 | OH |  |
| A-8 | OCH$_3$ | OC$_2$H$_5$ |
| A-9 | 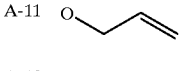 | O(n)C$_4$H$_9$ |
| A-10 | O(n)C$_8$H$_{17}$ | OCH$_3$ |
| A-11 | 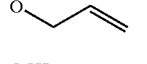 | 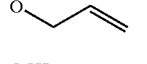 |
| A-12 | 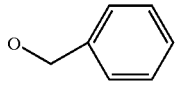 | OCH$_3$ |

TABLE 1-continued

Group A $$\underset{O}{\overset{X^1}{\underset{\|}{C}}}\!\!-\!\!X^2$$

| No. | X$^1$ | X$^2$ |
|---|---|---|
| A-13 | (phenoxy: O-C$_6$H$_5$) | OCH$_3$ |
| A-14 | O-CH$_2$CH$_2$-Cl | OCH$_3$ |
| A-15 | O-CH$_2$CH$_2$-OCOCH$_3$ | OC$_2$H$_5$ |
| A-16 | O-(CH$_2$)$_4$-CN | OC$_2$H$_6$ |
| A-17 | OCOCH$_3$ | OCH$_3$ |
| A-18 | OCO(n)C$_6$H$_{13}$ | OCH$_3$ |
| A-19 | OCO-C$_6$H$_5$ | OCH$_3$ |
| A-20 | OSO$_2$CH$_3$ | OCH$_3$ |
| A-21 | OSO$_2$(n)C$_4$H$_9$ | OCH$_3$ |
| A-22 | OSO$_2$-C$_6$H$_4$-CH$_3$ (p-tolyl) | OCH$_3$ |
| A-23 | OSO$_2$CF$_3$ | OC$_2$H$_5$ |
| A-24 | SCH$_3$ | OC$_2$H$_5$ |
| A-25 | S(n)C$_4$H$_9$ | OC$_2$H$_5$ |
| A-26 | S-C$_6$H$_5$ | OC$_2$H$_5$ |
| A-27 | S-(benzothiazol-2-yl) | OCH$_3$ |
| A-28 | S-(6-chlorobenzoxazol-2-yl) | OCH$_3$ |
| A-29 | F | O(n)C$_{12}$H$_{25}$ |
| A-30 | F | O-CH$_2$-C$_6$H$_5$ |
| A-31 | Cl | OCH$_3$ |
| A-32 | Cl | O-C$_6$H$_4$-C(CH$_3$)$_2$CH$_2$C(CH$_3$)$_3$ |

TABLE 1-continued

Group A (structure: CH2=C(CH2X¹)C(=O)X²)

| No. | X¹ | X² |
|---|---|---|
| A-33 | Br | O(n)C₄H₅ |
| A-34 | Br | OCH(C₂H₅)(C₄H₉) (3-heptyloxy) |
| A-35 | I | O(n)C₄H₉ |
| A-36 | I | OCH₂CH₂C₆H₅ |
| A-37 | N(CH₃)₂ | OC₂H₅ |
| A-38 | morpholino (N-morpholinyl) | OC₂H₅ |
| A-39 | pyrrolidin-1-yl | OC₂H₅ |
| A-40 | thiomorpholino | OC₂H₅ |
| A-41 | 4-(ethoxycarbonyl)piperidin-1-yl (—CO₂C₂H₅) | OC₂H₅ |
| A-42 | N(CH₃)(CH₂C₆H₅) | OC₂H₅ |
| A-43 | N(CH₂CH₂OH)₂ | OC₂H₅ |
| A-44 | N(C₆H₅)₂ | OC₂H₅ |

TABLE 1-continued

Group A $$\begin{array}{c}\diagup X^1\\ \diagup\\ \diagdown C-X^2\\ \parallel\\ O\end{array}$$

| No. | X¹ | X² |
|---|---|---|
| A-45 | N(CH₂CH=CH₂)₂ | OC₂H₅ |
| A-46 | NHCOCH₃ | OCH₃ |
| A-47 | NHCO(n)C₄H₉ | O(n)C₄H₉ |
| A-48 | N(COCH₃)(CH₃) | OCH₃ |
| A-49 | NHSO₂CH₃ | O(n)C₄H₉ |
| A-50 | NHSO₂–C₆H₄–CH₃ | O(n)C₄H₉ |
| A-51 | OCOCH₃ | OCH₂CH₂OH |
| A-52 | OCOCH₃ | O(CH₂)₄OCH₃ |
| A-53 | OCOCH₃ | OCH₂CH₂Cl |
| A-54 | OCOCH₃ | OCH₂CH₂N⁺(CH₃)₂Cl⁻ |
| A-55 | OCOCH₃ | OCH₂CH₂N⁺(CH₃)₂PF₆⁻ |
| A-56 | OCOC₂H₅ | O(CH₂)₆OCOCH₃ |
| A-57 | OCOC₂H₅ | O(CH₂)₃OSO₂–C₆H₄–CH₃ |
| A-58 | OCOC₂H₅ | O–C₆H₁₀–OH (1,4-cyclohexyl) |
| A-60 | N(SO₂C₂H₅)(C₂H₅) | OCH₃ |
| A-70 | OCOCH₃ | O(CH₂)₃PO₃H₂ |
| A-71 | OCOCH₃ | O(CH₂)₃OPO₃H₂ |

TABLE 1-continued

Group A

[structure: CH2=C(CH2X1)(C(=O)X2)]

| No. | X¹ | X² |
|---|---|---|
| A-72 | OCOCH₃ | O-CH₂CH₂CH₂-CO₂H |
| A-73 | O-CH₂-C₆H₅ | OH |
| A-74 | O-CH₂-C₆H₅ | O⁻Na⁺ |
| A-75 | O-CH₂-C₆H₅ | O-CH₂CH₂CH₂-SO₃H |
| A-76 | O-CH₂-C₆H₅ | O-CH₂CH₂CH₂-SO₃⁻K⁺ |
| A-77 | O-CH₂-CH=CH₂ | O-(CH₂)₄-PO₃(C₂H₅)₂ |
| A-78 | O-CH₂-CH=CH₂ | O-(CH₂)₄-SO₂-C₆H₁₁ |
| A-79 | OH | OC₂H₅ |
| A-80 | O-CH₂CH₂-O-CH₂CH₂-OCH₃ | OCH₃ |
| A-81 | OCONH-C₆H₅ | OCH₃ |
| A-82 | OCONHSO₂-C₆H₄-CH₃ | OCH₃ |
| A-83 | NHCONH-C₆H₅ | OCH₃ |
| A-84 | NHCO₂(n)C₆H₁₃ | OCH₃ |
| A-85 | OCSNH(n)C₄H₉ | OCH₃ |

TABLE 2

Group B

B-1, B-2, B-3, B-4, B-5, B-6, B-7, B-8, B-9

TABLE 3

Group C

| No. | $X^1$ |
|---|---|
| C-1 | OH |
| C-2 | $OCH_3$ |
| C-3 | O-iPr |
| C-4 | $O(n)C_8H_{17}$ |
| C-5 | O-allyl |
| C-6 | O-benzyl |
| C-7 | O-phenyl |
| C-8 | $OCH_2CH_2Cl$ |
| C-9 | $OCH_2CH_2OCOCH_3$ |
| C-10 | $O(CH_2)_4CN$ |
| C-11 | $OCOCH_3$ |
| C-12 | $OCO(n)C_6H_{13}$ |
| C-13 | OCO-phenyl |
| C-14 | $OSO_2CH_3$ |
| C-15 | $OSO_2(n)C_4H_9$ |
| C-16 | $OSO_2$-(p-tolyl) |
| C-17 | $OSO_2CF_3$ |
| C-18 | $SCH_3$ |
| C-19 | $S(n)C_4H_9$ |
| C-20 | S-phenyl |
| C-21 | S-benzothiazol-2-yl |
| C-22 | S-(6-chlorobenzoxazol-2-yl) |

TABLE 3-continued

Group C $$\text{CH}_2=\text{C}(\text{CN})-\text{CH}_2-X^1$$

| No. | $X^1$ |
|---|---|
| C-23 | F |
| C-24 | Cl |
| C-25 | Br |
| C-26 | I |
| C-27 | N(CH$_3$)$_2$ |
| C-28 | morpholino (N-CH$_2$CH$_2$-O-CH$_2$CH$_2$) |
| C-29 | pyrrolidino |
| C-30 | thiomorpholino |
| C-31 | 4-(ethoxycarbonyl)piperidino (N-piperidyl-CO$_2$C$_2$H$_5$) |
| C-32 | N(CH$_3$)(CH$_2$C$_6$H$_5$) |
| C-33 | N(CH$_2$CH$_2$OH)$_2$ |
| C-34 | N(C$_6$H$_5$)$_2$ |
| C-35 | N(CH$_2$CH=CH$_2$)$_2$ |
| C-36 | NHCOCH$_3$ |
| C-37 | NHCO(n)C$_4$H$_9$ |
| C-38 | N(COCH$_3$)(CH$_3$) |
| C-39 | NHSO$_2$CH$_3$ |
| C-40 | NHSO$_2$-C$_6$H$_4$-CH$_3$ |
| C-41 | OCOCH$_3$ |
| C-42 | N(SO$_2$C$_2$H$_5$)(C$_2$H$_5$) |
| C-43 | O-CH$_2$CH$_2$-O-CH$_2$CH$_2$-OCH$_3$ |
| C-44 | OCONH-C$_6$H$_5$ |
| C-45 | OCONHSO$_2$-C$_6$H$_4$-CH$_3$ |
| C-46 | NHCONH-C$_6$H$_5$ |
| C-47 | NHCO$_2$(n)C$_6$H$_{13}$ |
| C-48 | OCSNH(n)C$_4$H$_9$ |

The polymer for use in the present invention may be a homopolymer composed of only a constituting unit corresponding to the monomer having a structure represented by formula (I) or a copolymer composed of other constituting units in addition to the constituting unit corresponding to the monomer having a structure represented by formula (I).

Suitable examples of other constituting units include those derived from known monomers, for example, acrylates, methacrylates, acrylamides, methacrylamides, vinyl esters, styrenes, acrylic acid, methacrylic acid, acrylonitrile, maleic anhydride and maleimide.

Specific examples of the acrylates include methyl acrylate, ethyl acrylate, (n- or iso)propyl acrylate, (n-, iso or tert-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl)ethyl acrylate, furfuryl acrylate, tetrahydrofurfuryl acrylate, phenyl acrylate, chlorophenyl acrylate and sulfamoylphenyl acrylate.

Specific examples of the methacrylates include methyl methacrylate, ethyl methacrylate, (n- or iso)propyl methacrylate, (n-, iso or tert-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofurfuryl methacrylate, phenyl methacrylate, chlorophenyl methacrylate and sulfamoylphenyl methacrylate.

Specific examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl) acrylamide, N-(phenylsulfonyl)acrylamide, N-(tolylsolfonyl)acrylamide, N,N-dimethylacrylamide, N-methyl-N-phenylacrylamide and N-hydroxyethyl-N-methylacrylamide.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl) methacrylamide, N-(sulfamoylphenyl)methacrylamide, N-(phenylsulfonyl)methacrylamide, N-(tolylsolfonyl) methacrylamide, N,N-dimethylmethacrylamide, N-methyl-N-phenylmethacrylamide and N-hydroxyethyl-N-methylmethacrylamide.

Specific examples of the vinyl esters include vinyl acetate, vinyl butyrate and vinyl benzoate.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

Of such co-monomers, acrylates, methacrylates, acrylamides, methacrylamides, vinyl esters and styrenes each having not more than 20 carbon atoms, acrylic acid, methacrylic acid and acrylonitrile are particularly preferably used.

The polymer containing a repeating unit corresponding to the monomer having a structure represented by formula (I) may be any of a random polymer, block polymer and graft polymer, and is preferably a random polymer.

Now, the polymer containing a repeating unit corresponding to the monomer having a structure represented by formula (I) is described in detail below.

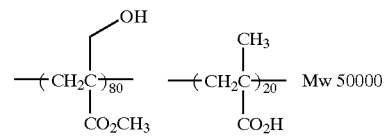

P-1

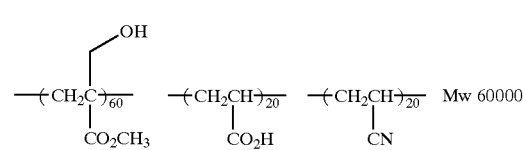

P-2

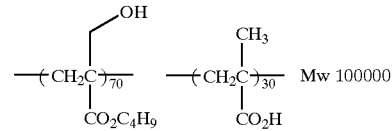

P-3

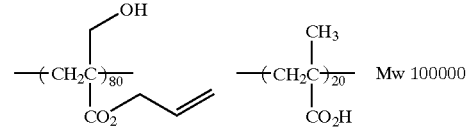

P-4

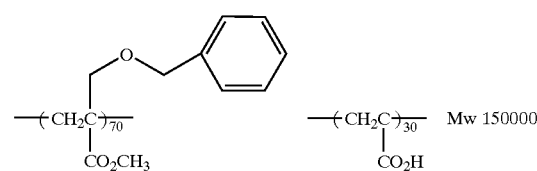

P-5

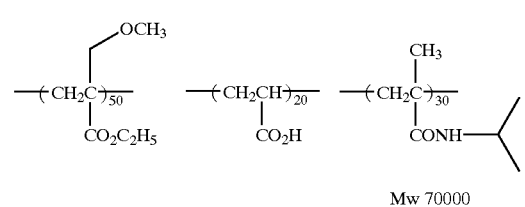

P-6

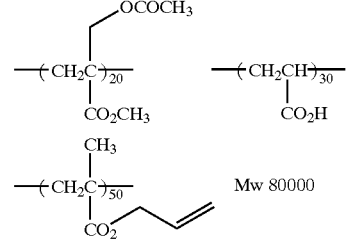

P-7

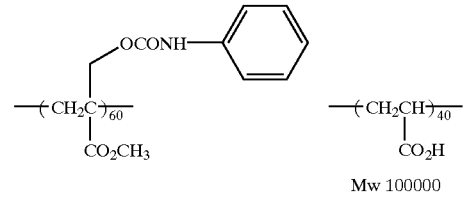

P-8

P-9
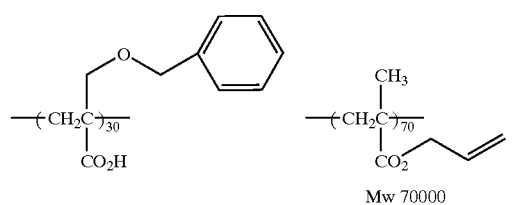
P-10
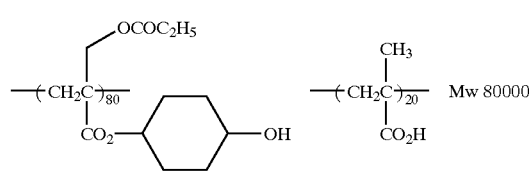
P-11
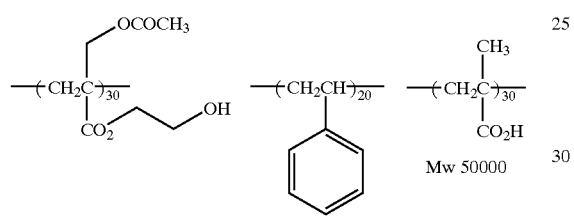
P-12
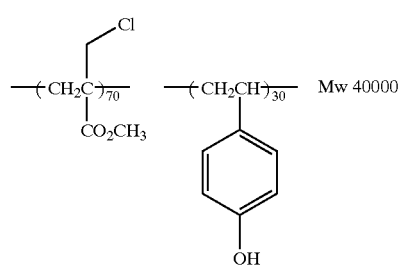
P-13
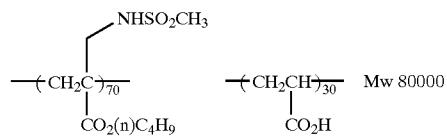
P-14
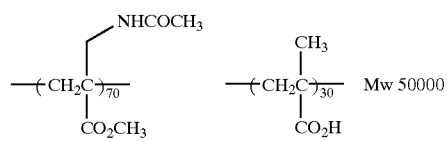
P-15
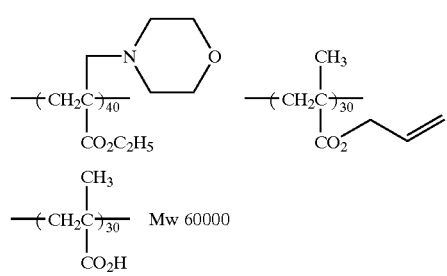
P-16
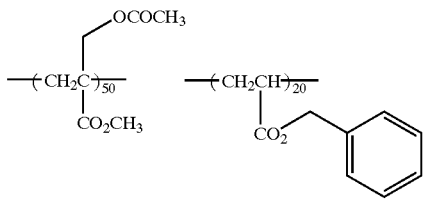
P-17
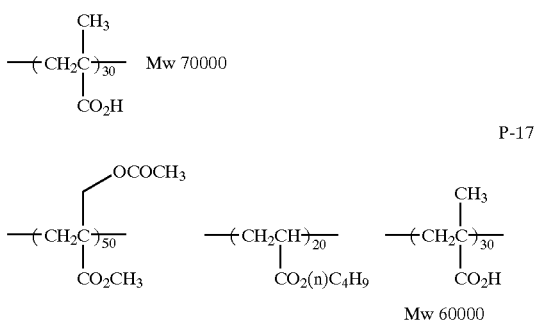
P-18
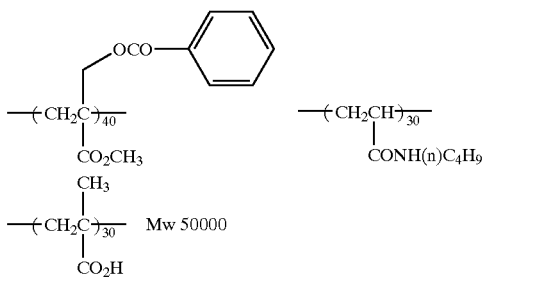
P-19
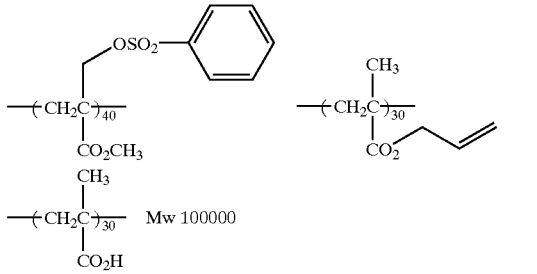
P-20
P-21
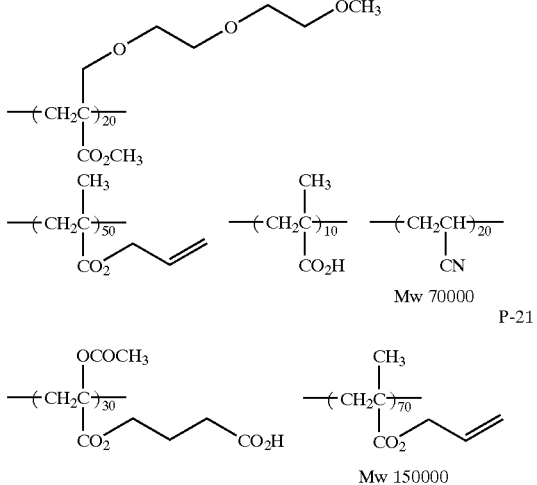

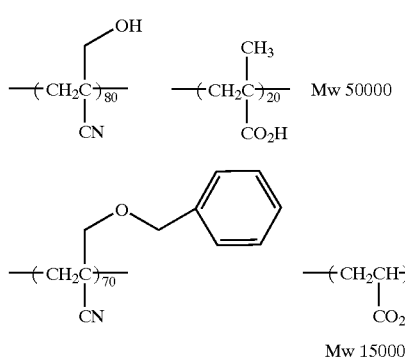

Mw 50000

P-22

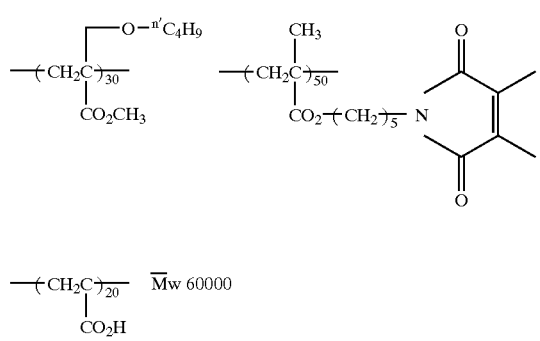

P1-3

Mw 150000

P-23

Preferred examples of the polymer containing a repeating unit corresponding to the monomer having a structure represented by formula (I) specifically include the following polymers i), ii) and iii):

i) Polymer having a maleimido photo-crosslinkable group
ii) Polymer having a reactive side chain causing photo-crosslinking with a diazo resin
iii) Polymer having a reactive side chain causing acid-crosslinking with a methylol compound i) Polymer Having a Maleimido Photo-crosslinkable Group Maleimido Group

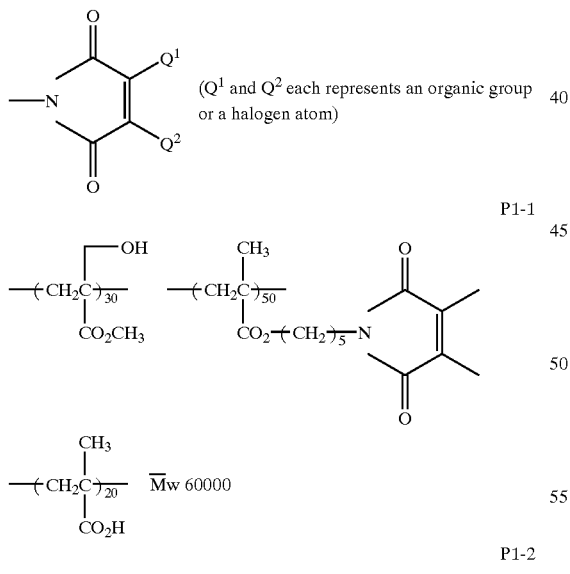

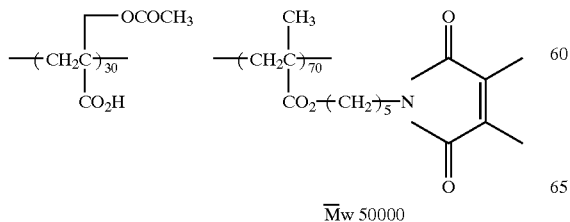

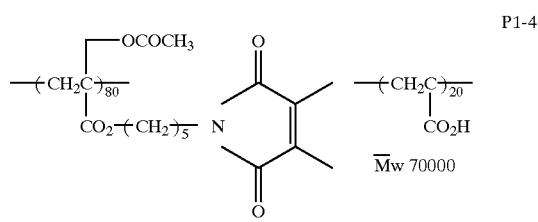

P1-4

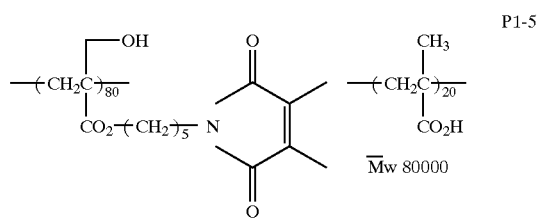

P1-5

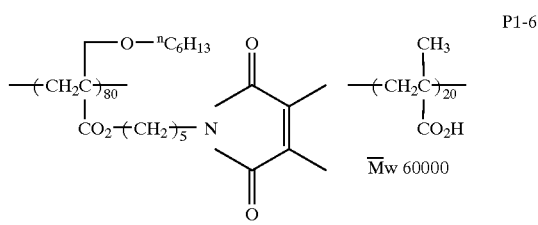

P1-6

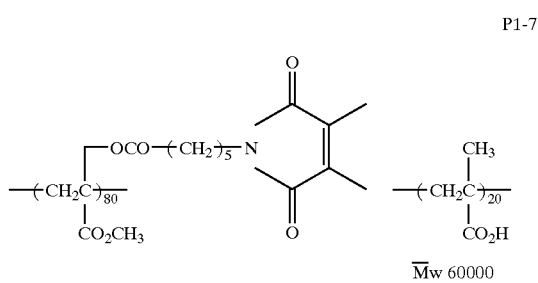

P1-7

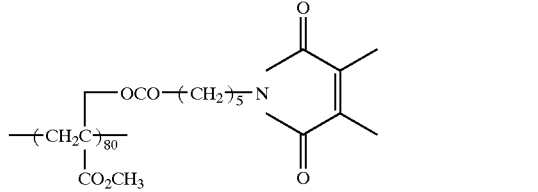

P1-8

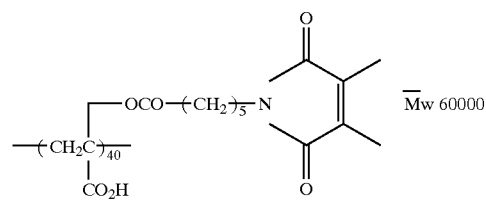
P1-9
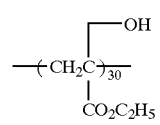
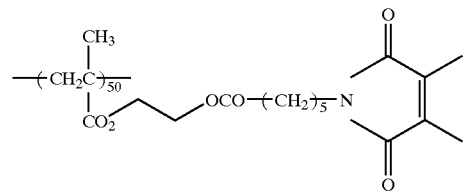
P1-10
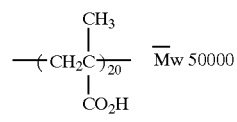
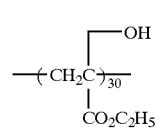
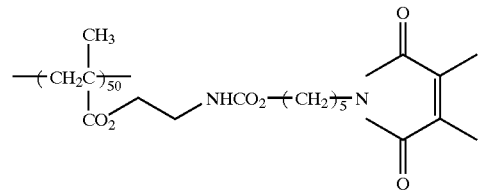
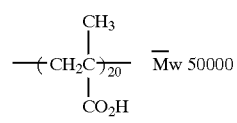
P1-11
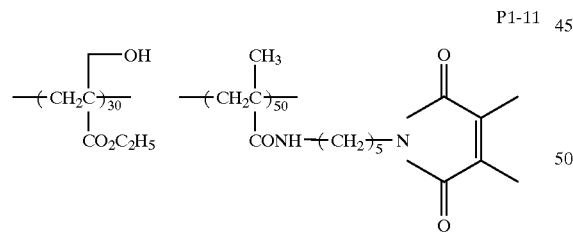
P1-12
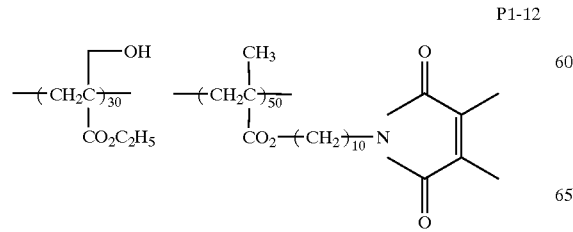
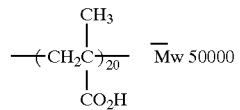
P1-13
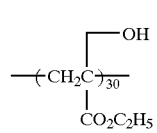
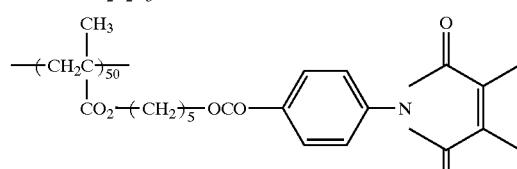
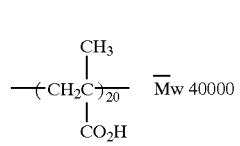
P1-14
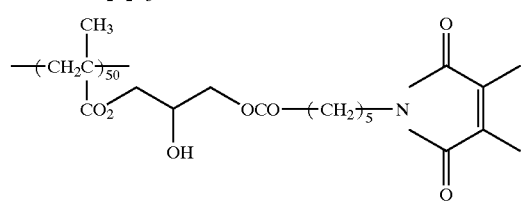
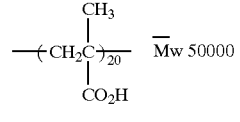
P1-15
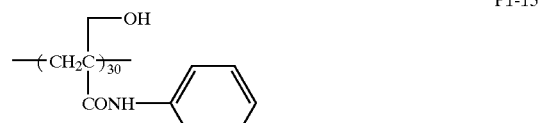
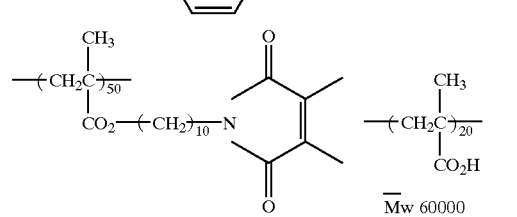
P1-16
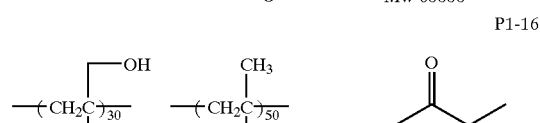
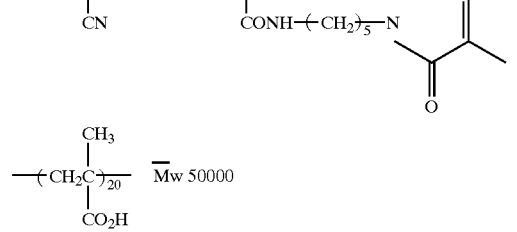

-continued
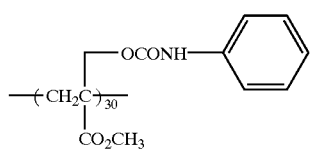
P1-17
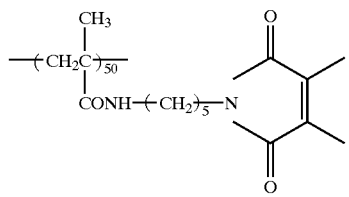 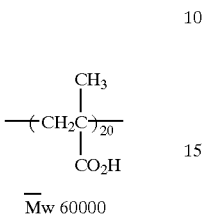
$\overline{M}w$ 60000
P1-18
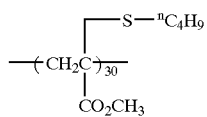
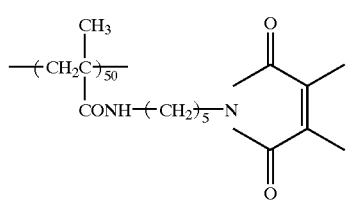 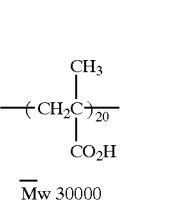
$\overline{M}w$ 30000
P1-19
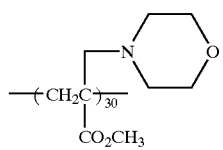
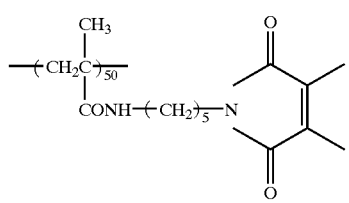
$\overline{M}w$ 40000
P1-20
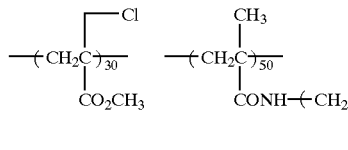
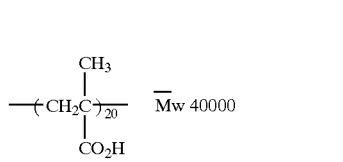
$\overline{M}w$ 40000
P1-21
-continued
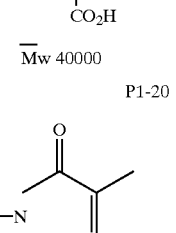
$\overline{M}w$ 40000
P1-22
P1-23
P1-24
P1-25
ii) Polymer Having a Reactive Side Chain Causing Photo-crosslinking with a Diazo Resin
Reactive Side Chain
—OH,  —C≡N,  —C(=O)—NH—R,
—NH—C(=O)—R
(R represents an organic group or a hydrogen atom)
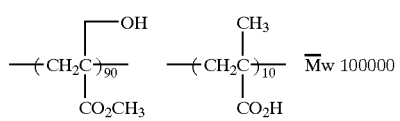
P2-1

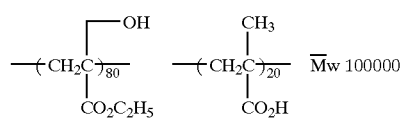
P2-2
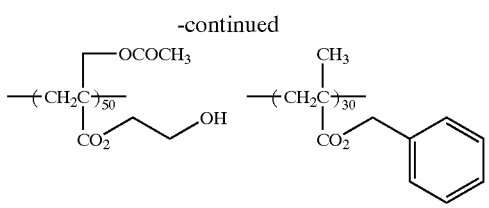
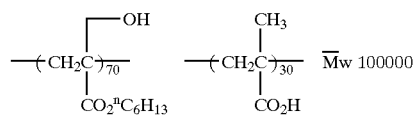
P2-3
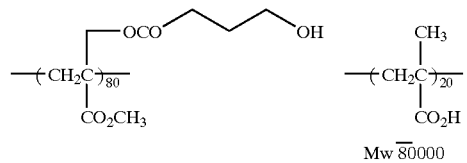
P2-4
P2-12
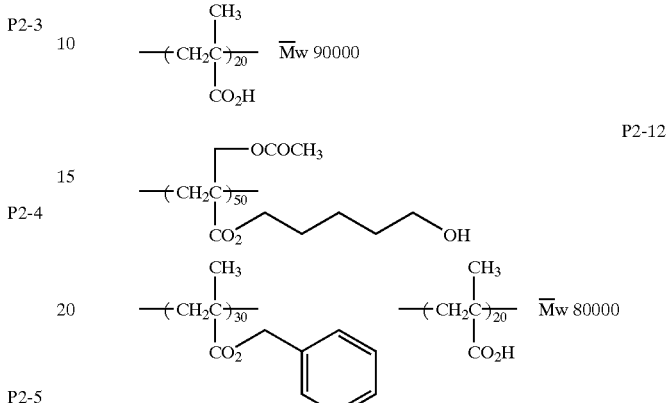
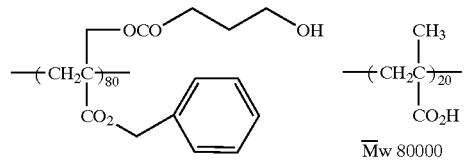
P2-5
P2-13
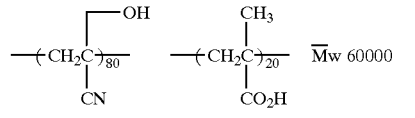
P2-6
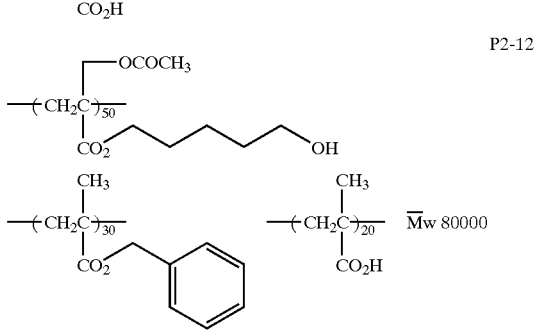
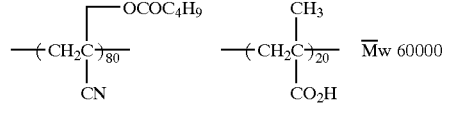
P2-7
P2-16
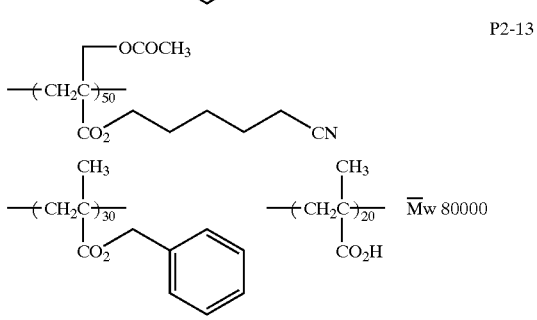
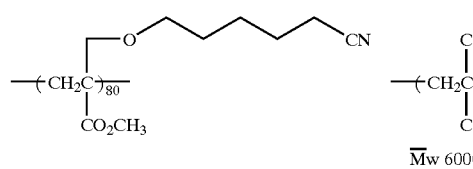
P2-8
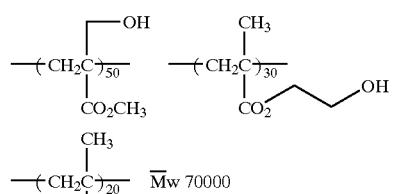
P2-9
P2-17
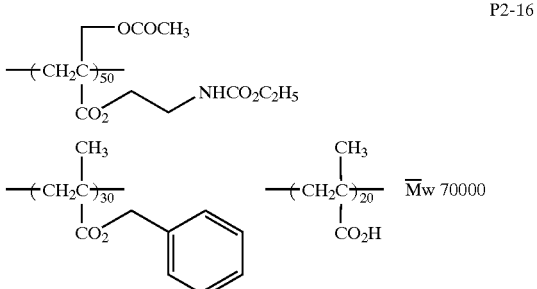
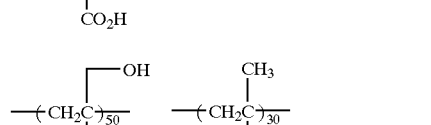
P2-10
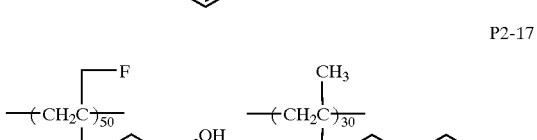
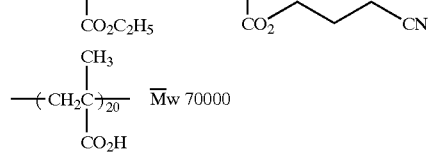
P2-18
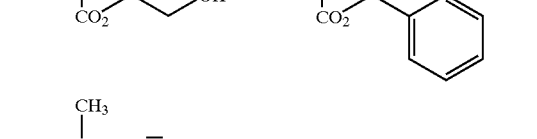

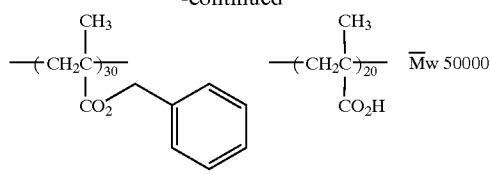
iii) Polymer Having a Reactive Side Chain Causing Acid-crosslinking with a Methylol Compound
Reactive Side Chain
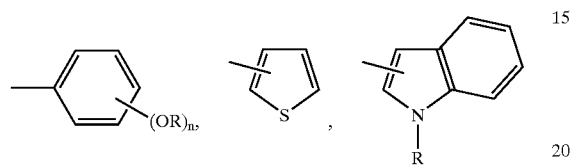
(R represents an organic group or a hydrogen atom, and n represents an integer of from 1 to 3)
P3-1
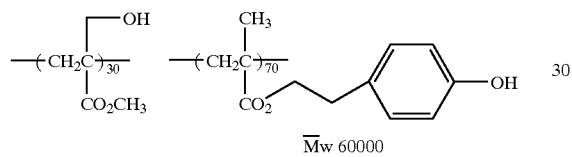
P3-2
P3-3
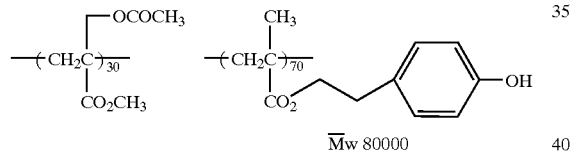
P3-4
P3-5
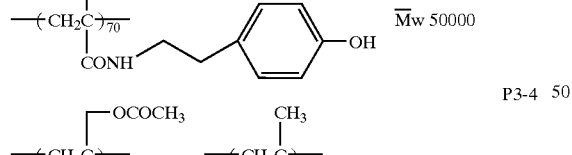
P3-6
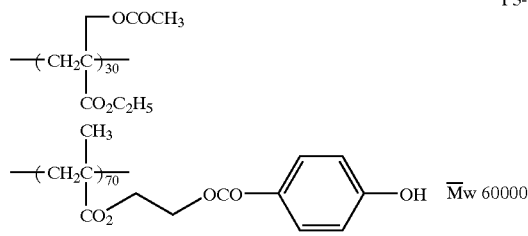
P3-7
P3-8
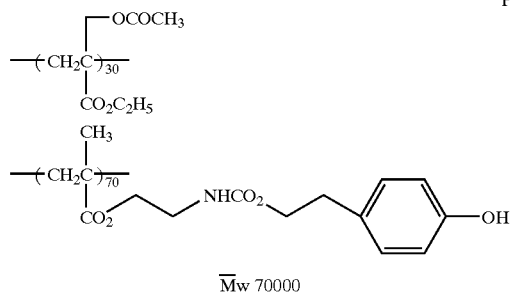
P3-9
P3-10
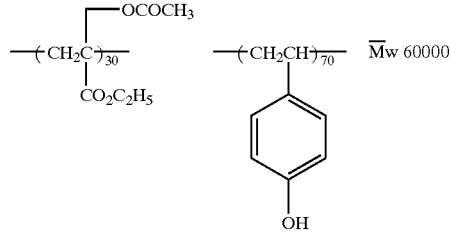
P3-11
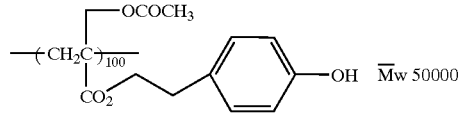
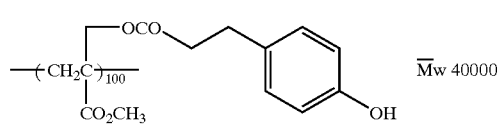
P3-12
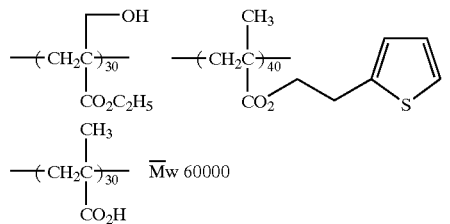
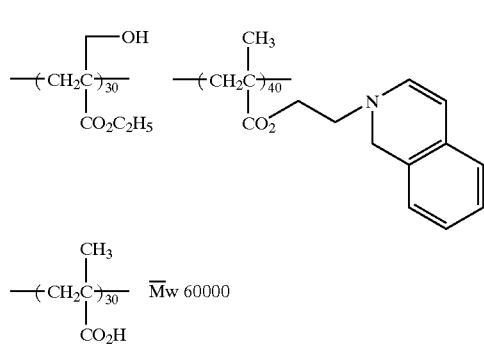
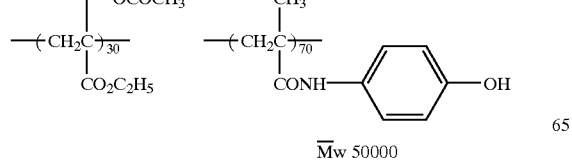

-continued

P3-13
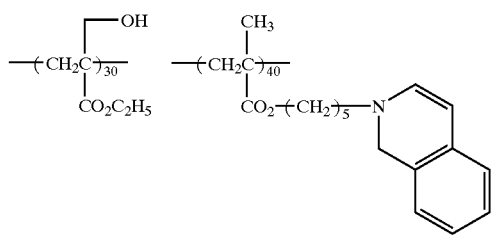

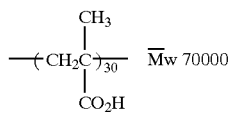
Mw 70000

P3-14
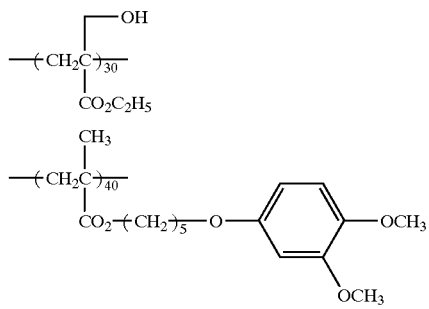

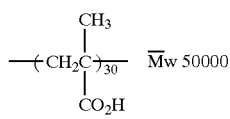
Mw 50000

P3-15
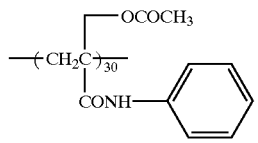

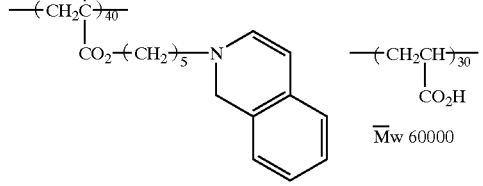
Mw 60000

P3-16
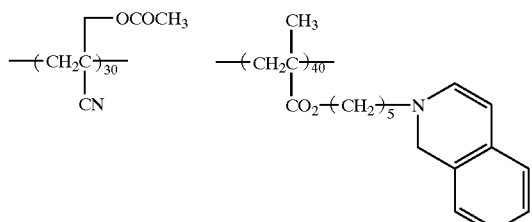

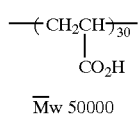
Mw 50000

-continued

P3-17
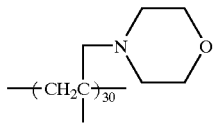
Mw 40000

These polymers can be synthesized by heating monomers corresponding to the repeating units described above and a radical thermal polymerization initiator in an appropriate solvent.

Photo-crosslinkable Polymer Compound

The photo-crosslinkable polymer compound, which can be suitably used together with the above-described polymer i), includes preferably a polymer having a structure unit derived from a monomer selected from Group A shown below, and the polymer may contain a copolymer component derived from a monomer selected from monomers (1) to (15) in Group B shown below.

Group A:

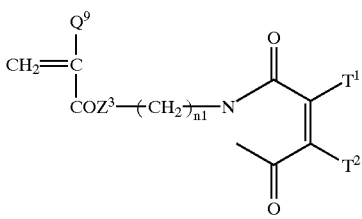

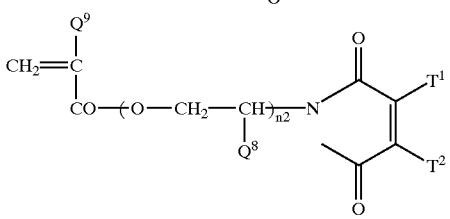

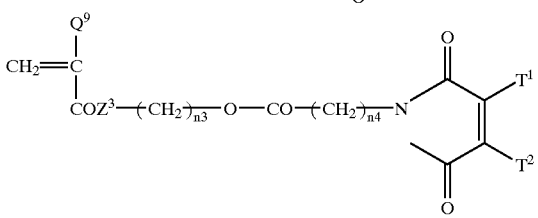

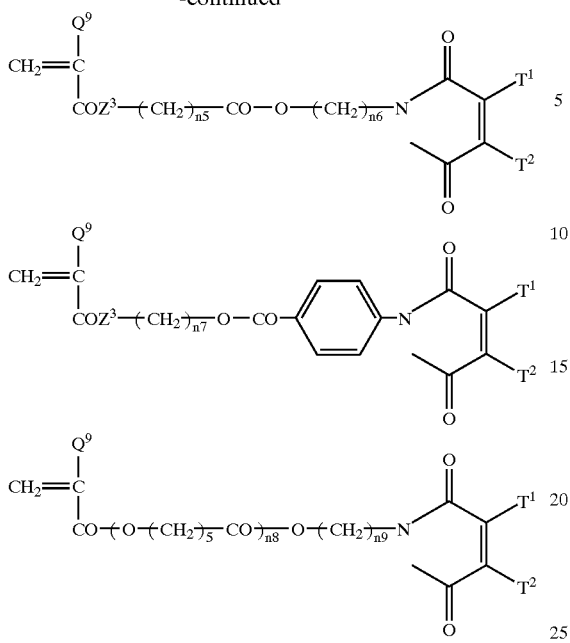

In the above formulae, $T^1$ and $T^2$ each represents a hydrogen atom, a chlorine atom, a bromine atom, an alkyl group having from 1 to 6 carbon atoms or a phenyl group which may have a substituent, or $T^1$ and $T^2$ may combine with each other to form a ring; $Q^8$ and $Q^9$ each represents a hydrogen atom or a methyl group; $Z^3$ represents —O— or —NH—; and $n^1$ to $n^9$ each represents an integer of 1 or more.

Also, monomers described in JP-A-52-988 are preferably used.

Group B:

(1) acrylamides, methacrylamides, acrylates and methacrylates each having an aromatic hydroxy group, and hydroxystyrenes, for example, N-(4-hydroxyphenyl) acrylamide, N-(4hydroxyphenyl)methacrylamide, o-, m- or p-hydroxystyrene, o-, m- or p-hydroxyphenyl acrylate or o-, m- or p-hydroxyphenyl methacrylate; (2) acrylates and methacrylates each having an aliphatic hydroxy group, for example, 2-hydroxyethyl acrylate, 2-hydroxyethyl methacrylate or 4-hydroxybutyl methacrylate; (3) unsaturated carboxylic acids, for example, acrylic acid, methacrylic acid, maleic anhydride or itaconic acid; (4) (substituted) alkyl acrylates, for example, methyl acrylate, ethyl acrylate, propyl acrylate, butyl acrylate, amyl acrylate, hexyl acrylate, cyclohexyl acrylate, octyl acrylace, benzyl acrylate, 2-chloroethyl acrylate, glycidyl acrylate or N-dimethylaminoethyl acrylate; (5) (substituted) alkyl methacrylates, for example, methyl methacrylate, ethyl methacrylate, propyl methacrylate, butyl methacrylate, amyl methacrylate, cyclohexyl methacrylate, benzyl methacrylate, glycidyl methacrylate or N-dimethylaminoethyl methacrylate; (6) acrylamides and methacrylamides, for example, acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide; (7) vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether; (8)vinyl esters, for example, vinyl acetate, vinyl chloroacetate, vinyl butyrate or vinyl benzoate; (9) styrenes, for example, styrene, α-methylstyrene or chlorostyrene; (10) vinyl ketones, for example, methyl vinyl ketone, ethyl vinyl ketone, propyl vinyl ketone or phenyl vinyl ketone; (11) olefins, for example, ethylene, propylene, isobutylene, butadiene or isoprene; (12N-vinylpyrrolidone, N-vinylcarbazole, 4-vinylpyridine, acrylonitrile or methacrylonitrile; (13) unsaturated imides, for example, maleimide, N-acryloylacrylamide, N-acetylmethacrylamide, N-propionylmethacrylamide or N-(p-chlorobenzoyl) methacrylamide; (14) methacrylamides, for example, N-(o-aminosulfonylphenyl)methacrylamide, N-(m-aminosulfonylphenyl)methacrylamide, N-(p-aminosulfonylphenyl)methacrylamide, N-(1-(3-aminosulfonyl)naphthyl)methacrylamide or N-(2-aminosulfonylethyl)methacrylamide, acrylamides having the same substituents as described in the methacrylamides above, methacrylates, for example, o-aminosulfonylphenyl methacrylate, m-aminosulfonylphenyl methacrylate, p-aminosulfonylphenyl methacrylate or 1-(3-aminosulfonyl)naphthyl methacrylate, and acrylates having the same substituents as described in the methacrylates above; and (15) unsaturated monomers having a crosslinkable group in the side chain thereof, for example, vinyl cinnamate.

Further, other monomers copolymerizable with the above-described monomers may be used. The photocrosslinkable polymer compounds also include a polymer obtained by modifying the copolymer prepared by copolymerization of the above-described monomers, for example, with glycidyl methacrylate or glycidyl acrylate, but they are not limited these polymers. More specifically, the photocrosslinkable polymer compound containing the unsaturated carboxylic acid (3) of Group (B) as a copolymerization component is preferably used. A carboxylic acid value of the copolymer is preferably from 0 to 4 meq/g, and more preferably from 0.5 to 3.5 meq/g.

Of the copolymers containing a component derived from the monomer selected from Group A and a component derived from the monomer selected from monomers (1) to (15) of Group B, copolymers containing a monomer selected from the monomers represented by the formulae shown below, as the monomer of Group A and a monomer selected from the monomers having an aromatic hydroxy group in monomers (1) of Group B, the monomers having an sulfonamido group in monomers (14) of Group B and the monomers in monomers (4) and (5) of Group B, particularly, ethyl acrylate, butyl acrylate, benzyl acrylate, methyl methacrylate, ethyl methacrylate, butyl methacrylate and benzyl methacrylate, as the monomer of Group B are preferably employed.

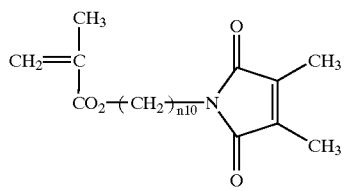

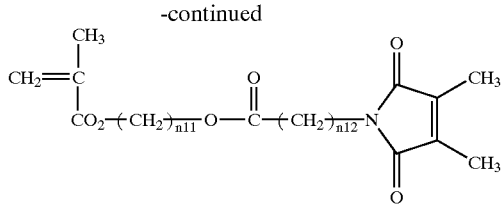

wherein $n^{10}$, $n^{11}$ and $n^{12}$ each represents an integer of 1 or more.

The photo-crosslinkable polymer compound has two or more photo-crosslinkable groups per mole on the average in the side chains thereof. A weight average molecular weight thereof is preferably not less than 1,000, and more preferably in a range of from 2,000 to 300,000. A number average molecular weight thereof is preferably not less than 800, and more preferably in a range of from 1,000 to 250,000. A polydispersity index (weight average molecular weight/ number average molecular weight) thereof is preferably not less than 1, and more preferably in a range of from 1.1 to 10.

The photo-crosslinkable polymer compound is incorporated ordinarily from 0 to 99% by weight, preferably from 0 to 70% by weight, and more preferably from 0 to 50% by weight, based on the solid content of the photosensitive composition.

(Diazo Resin)

The diazo resin, which can be suitably used together with the above-described polymer ii), includes preferably an inorganic salt of diazo resin, i.e., an organic solvent-soluble reaction product of a condensate of p-diazodiphenylamine and formaldehyde or acetaldehyde with hexafluorophosphate or tetrafluoroborate; a reaction product of the above-described condensate with a sulfonic acid, e.g., p-toluenesulfonic acid or a salt thereof, a phosphinic acid, e.g., benzenephosphinic acid or a salt thereof, or a hydroxy group-containing compound, e.g., 2,4-dihydroxybenzophenone, 2-hydroxy-4-methoxybenzophenone-5-sulfonic acid or a salt thereof as described in U.S. Pat. No. 3,300,309; an organic solvent-soluble diazo resin, i.e., a reaction product of the above-described condensate with a sulfonic acid having a long-chain alkyl group as described in JP-A-58-209733, JP-A-62-175731 and JP-A-63-26264; and a co-condensation diazo resin with an aromatic compound as described in JP-B-49-48001.

A diazo resin prepared by a ring opening polymerization reaction with an epoxy resin as described in JP-A-4-338756 and JP-A-4-347856, and a diazo resin prepared by a reaction with an olefinically unsaturated compound as described in JP-A-58-187925 may also be used. Other examples of the diazo resin preferably used in the present invention include a co-condensate containing an aromatic compound having at least one group selected from a carboxy group, a sulfonic acid group, a sulfinic acid group, a phosphorus oxyacid group and a hydroxy group and a diazonium compound, preferably an aromatic diazonium compound, as constituting units.

The aromatic compound having at least one group selected from a carboxy group, a sulfonic acid groups a sulfinic acid group, a phosphorus oxyacid group and a hydroxy group (hereinafter, also referred to as an acid group) is a compound including an aromatic ring substituted with at least one of the acid groups in the molecule thereof. Two or more of the acid groups may be present on the same aromatic ring, The aromatic ring includes a benzene ring or a naphthalene ring. The acid group may be bonded directly or through a connecting group to the aromatic ring. Examples of the connecting group include a group containing an ether bond and having one or more carbon atoms.

Specific examples of the aromatic compound having at least one group selected from a carboxy group, a sulfonic acid group, a sulfinic acid group, a phosphorus oxyacid group and a hydroxy group include benzoic acid, o-chlorobenzoic acid, m-chlorobenzoic acid, p-chlorobenzoic acid, phthalic acid, terephthalic acid, diphenylacetic acid, phenoxyacetic acid, p-methoxyphenylacetic acid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)benzoic acid, 4-(p-methoxybenzoyl)benzoic acid, 4-(p-methylanilino) benzoic acid, 4-phenylsulfonylbenzoic acid, phenol, (o-, m- or p-)cresol, xylenol, resorcinol, 2-methylresolcinol, (o-, m- or p-)methoxyphenol, m-ethoxyphenol, catechol, phloroglucine, p-hydroxyethylphenol, naphthol, pyrogallol, hydroquinone, p-hydroxybenzyl alcohol, 4-chlororesorcinol, biphenyl-4,4'-diol, 1,2,4-benzenetriol, bisphenol A, 2,4-dihydroxybenzophenone, 2,3,4-trihydroxybenzophenone, p-hydroxyacetophenone, 4,4'-dihydroxydiphenyl ether, 4,4'-dihydroxydiphenylamine, 4,4'-dihydroxydiphenylsulfidocumylphenol, (o-, m- or p-)chlorophenol, (o-, m- or p-)bromophenol, salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2-methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-methylbenzoic acid, 4-chloro-2, 6-dihydroxybenzoic acid, 4-methoxy-2,6-dihydroxybenzoic acid, gallic acid, phloroglucinecarboxylic acid, 2,4,5-trihydroxybenzoic acid, m-galloylgallic acid, tannic acid, m-benzoylgallic acid, m-(p-toluoyl)gallic acid, protocatechoylgallic acid, 4,6-dihydroxyphthalic acid, (2,4-dihydroxyphenyl)acetic acid, (2,6-dihydroxyphenyl)acetic acid, (3,4,5-trihydroxyphenyl)acetic acid, p-hydroxymethylbenzoic acid, p-hyrdoxyethylbenzoic acid, 4p-hydroxyphenyl)methylbenzoic acid, 4-(o-hydroxybenzoyl)benzoic acid, 4-(2,4-dihydroxybenzoyl) benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl) benzoic acid, 4-(p-hydroxyphenylthio)benzoic acid, benzenesulfonic acid, p-toluenesulfonic acid, benzenesulfinic acid, p-toluenesulfinic acid, aniline-2-sulfonic acid, 4-amino-m-toluenesulfonic acid, 2,5-diaminobenzenesulfonic acid, 1-naphthalensulfonic acid, 1-amino-2-naphthalensulfonic acid, 5-amino-2-naphthalensulfonic acid, 7-amino-1,3-naphthalenedisulfonic acid, 2-amino-i ,5-naphthalenedisulfonic acid, 2-sulfobenzoic acid (the sulfonic acid or sulfinic acid may be free sulfonic acid, free sulfinic acid or a salt thereof, for example, a metal salt, e.g., sodium, potassium, lithium, cesium, calcium, barium, magnesium, aluminum or zinc salt or an unsubstituted or substituted ammonium salt), phenylphosphoric acid, phenylphosphorous acid, phenylphosphonic acid, phenylphosphonous acid, phenylphosphinic acid, phenylphosphinous acid, benzylphosphoric acid, benzylphosphorous acid, benzylphosphonic acid, benzylphosphonous acid, benzylphosphinic acid, benzylphosphinous acid, 2-phenylethylphosphoric acid, 2-phenylethylphosphorous acid, 1-naphthylphophoric acid, 1-naphthylphosphrous acid, 1-naphthylphosphonic acid, 1-naphthylphosphonous acid, 1-naphthylphophinic acid, 1-naphthylphosphinous acid and 2-naphthylphophoric acid.

Of the compounds, 4-methoxybenzoic acid, 3-chlorobenzoic acid, 2,4-dimethoxybenzoic acid, p-phenoxybenzoic acid, 4-anilinobezoic acid, phenoxyacetic acid, phenylacetic acid, p-hydroxybenzoic acid, 2,4-dihydroxybenzoic acid, benzenesulfonic acid, p-toluenesulfinic acid, 1-naphthalenesulfonic acid, phenylphosphoric acid and phenylphosphonic acid are particularly preferred.

The aromatic diazonium compound, which forms the constituting unit of the co-condensation diazo resin, includes, for example, diazonium salts as described in JP-B-49-48001, and preferably diphenylamine-4-diazonium salts. The diphenylamine-4-diazonium salts are derived from 4-aminodiphenylamines. Examples of the 4-aminodiphenylamine include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyldiphenylamine, 4-amino-3-ethoxydiphenylamine, 4-amino-3β-hydroxyethoxydiphenylamine, 4-aminodiphenylamine-2-sulfonic acid, 4-aminodiphenylamine-2-carboxylic acid and 4-aminodiphenylamine-2'-carboxylic acid. Particularly, 4-amino-3-methoxydiphenylamine and 4-aminodiphenylamine are preferred.

The co-condensation diazo resin can be obtained by condensation polymerization of a diazonium salt, an aromatic compound having the acid group and an aldehyde, e.g., paraformaldehyde, acetaldehyde or benzaldehyde or a ketone, e.g., acetone or acetophenone in sulfuric acid, phosphoric acid or hydrochloric acid according to known methods, for example, methods described in *Photo. Sci. Eng.*, Vol. 17, page 33 (1973) and U.S. Pat. Nos. 2,063,631 and 2,679,498. Also, the resin can be synthesized using methods as described in JP-B-49-45322 and JP-B-49-45323.

A molar ratio of the aromatic compound having the acid group to the aromatic diazo compound used in synthesis is from 1:0.1 to 0.1:1, preferably from 1:0.5 to 0.2:1, and more preferably from 1:1 to 0.2:1. A mixture of the aromatic compound having the acid group, the aromatic diazo compound and an aldehyde or ketone is reacted in the molar ratio of the sum total of the aromatic compound having the acid group and the aromatic diazo compound to the aldehyde or ketone of from 1:0.5 to 1:2.0, and preferably from 1:0.7 to 1:1.5, at low temperature for a short period of time, egg., about 3 hours, thereby obtaining the co-condensation diazo resin.

Diazo resins other than the co-condensation diazo resin of the aromatic compound having the acid group, which can also be preferably used in the present invention, include diazo resins obtained by condensation with an aldehyde having an acid group or an acetal compound thereof as described in JP-A-4-18559, JP-A-3-163551 and JP-A-3-253857.

Now, the counter anion of the diazo resin is described in detail below.

The counter anion includes an anion which forms a stable salt with the diazo resin and makes the diazo resin soluble in an organic solvent. The counter anion includes an organic carboxylic acid, e.g., decanoic acid or benzoic acid, an organic phosphoric acid, e.g., phenylphosphoric acid, and a sulfonic acid. Typical examples thereof include an aliphatic or aromatic sulfonic acid, for example, methanesulfonic acid, a fluoroalkanesulfonic acid, e.g., trifluoromethanesulfonic acid, lauryl sulfonic acid, dioctylsulfosuccinic acid, dicyclohexylsulfosuccinic acid, camphorsulfonic acid, tolyloxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichiorobeuzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, decylbenzenesulfonic acid, dodecylbenzenesulfonic acid, butoxybenzenesulfonic acid, dodecyloxybenzenesulfonic acid, 2-hydroxy-4-methoxybenzophenone-5-sulfonic acid; isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid or dimethyl 5-sulfoisophthalate; an aromatic compound containing a hydroxy group, for example, 2,2',4,4'-tetrahydroxybenzophenone, 1,2,3-trihydroxybenzophenone or 2,2',4-trihydroxybenzophenone; a halogenated Lewis acid, for example, hexafluorophosphoric acid or tetrafluoroboric acid; and a perhalogen acid, for example, $ClO_4$ or $IO_4$, but the present invention should not be construed as being limited thereto. Of the compounds, butylnaphthalenesulfonic acid, dibutylnaphthalenesulfonic acid, hexafluorophosphoric acid, 2-hydroxy-4-methoxybenzophenone-5-sulfonic acid and dodecylbenzenesulfonic acid are particularly preferred.

The diazo resin for use in the present invention having an appropriate molecular weight can be obtained by controlling a molar ratio of the monomers used and conditions for the condensation. The molecular weight of the diazo compound is suitably from about 400 to 100,000, and preferably from about 800 to 8,000 in order to be effectively employed for the desired use of the present invention. The diazo resins may be used individually or as a mixture of two or more thereof.

The diazo resin is ordinarily incorporated into the photosensitive composition in an amount of from 1 to 70% by weight, and preferably from 3 to 60% by weight, based on the solid content of the photosensitive composition.

(Methylol Compound)

The methylol compound, which can be suitably used together with the above-described polymer iii), includes preferably methylol compounds as described in JP-A-11-133594, alkoxymethyl compounds and resol resins, as a compound crosslinkable upon an acid in the negative working photosensitive composition of the present invention.

The compound crosslinkable upon an acid is ordinarily used in an amount of from 5 to 70% by weight, and preferably from 10 to 50% by weight, based on the total solid content of the photosensitive composition of the present invention. When the amount of compound used is less than 5% by weight, a film strength of image area deteriorates at image formation, and on the other hand, the amount of compound exceeding 70% by weight is disadvantageous in view of the preservation stability.

Also, methylol compounds as described in JP-A-2000-66394 and JP-A-2000-35669 are preferably used.

It is also preferred that the above-described polymers i), ii) and iii) are used in combination and the above-described photo-crosslinkable polymer compound, diazo resin and methylol compound are used in combination.

<Other Additives>

(Photosensitizer)

A photosensitizer may be used in the photosensitive composition of the present invention, if desired. A triplet photosensitizer having an absorption maximum capable of performing substantially sufficient light absorption in a range of 300 nm or more is preferably used as the photosensitizer. Preferred examples of the triplet photosensitizer include a benzophenone derivative, a benzanthrone derivative, a quinone, an aromatic nitro compound, a naphthothiazoline derivative, a benzothiazoline derivative, a thioxanthone, a naphthothiazole derivative, a ketocoumarin compound, a benzothiazole derivative, a benzodithiol derivative, a naphthofuranone compound, a pyrylium salt and a thiapyrylium salt. Specific examples thereof include Michler's ketone, N,N'-diethylaminobenzophenone, benzanthrone, (3-methyl-1,3-diaza-1,9-benz)anthronepicramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonyl-bis(7-diethylaminocoumarin), 2,4,6-triphneylthiapyrylium perchlorate, 2-(p-chlorobenzoyl)naphtothiazole, 2-(5-tert-butyl-1,3-benzodithiol-2-idene)-1,3-diethylthiobarbituric acid.

Also, compounds as described in JP-A-3-54566, JP-A-2-236552, JP-A-2-173646 and JP-A-2-131236 are also preferably used.

An amount of the photosensitizer used is ordinarily from 1 to 20% by weight, and preferably from 3 to 10% by weight, based on the total solid content of the photosensitive composition of the present invention.

In addition, infrared absorbing dyes (including dyes and pigments) described below are suitably used as the sensitizing dyes.

Preferred examples of the infrared absorbing dye include cyanine dyes as described, for example, in JP-A-58-125246, JP-A-59-84356, JP-A-59-202829 and JP-A-60-78787, and cyanine dyes as described in British Patent 434,875.

Other preferred examples of the infrared absorbing dye include near infrared absorbing sensitizers as described in U.S. Pat. No. 5,156,938, substituted arylbenzo(thio)pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063 and JP-A-59-146061, cyanine dyes as described in JP-A-59-216146, pentamethinethiopyrylium salts as described in U.S. Pat. No. 4,283,475, and pyrylium compounds as described in JP-B-5-13514 and JP-B-5-19702.

Other preferred examples of the infrared absorbing dye include near infrared absorbing dyes represented by formulae (I) and (II) in U.S. Pat. No. 4,756,993, and phthalocyanine dyes as described in EP-A-916,513.

Anionic infrared absorbing dyes as described in JP-A-11-338131 are also preferably used. The anionic infrared absorbing dye means a dye that does not have a cation structure in the dye skeleton substantially absorbing an infrared ray and has an anion structure. The anionic infrared absorbing dye includes, for example, (c1) anionic metal complex, (c2) anionic carbon black, (c3) anionic phthalocyanine, and (c4) compound represented by formula (6) shown below. A counter cation of the anionic infrared absorbing dye is a monovalent or polyvalent cation containing a proton.

$$[G_a^- - M - G_b]_m \ X^{m+} \quad (6)$$

The anionic metal complex (c1) is a complex in which the center metal and ligand thereof substantially absorbing light form an anion, as a whole.

The anionic carbon black (c2) includes carbon black having bonded thereto an anionic group, for example, sulfonic acid, carboxylic acid or phosphonic acid, as a substituent. In order to introduce the anionic group into carbon black, for example, a method of oxidizing carbon black with the desired acid as described in Carbon Black Kyokai ed., Carbon Black Binran, Third Edition, page 12, Carbon Black Kyokai (Apr. 5, 1995) can be employed.

The anionic phthalocyanine (c3) is a compound in which the anionic group as described in the anionic carbon black (c2) is bonded to a phthalocyanine skeleton as a substituent to form an anion, as a whole.

The compound (c4) represented by formula (6) will be described in detail below.

In formula (6) above, $G_a^-$ represents an anionic substituent; $G_b$ represents a neutral substituent; $X^{m+}$ represents a monovalent to m-valent cation containing a proton; m represents an integer of from 1 to 6; and M represents a conjugated chain. The conjugated chain represented by M may contain a substituent and/or a cyclic structure. The conjugated chain of M is represented by the following formula:

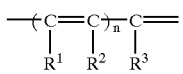

wherein $R^1$, $R^2$ and $R^3$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, or $R^1$, $R^2$ and $R^3$ may combine with each other to form a cyclic structure; and n represents an integer of from 1 to 8.

Cationic infrared absorbing dyes and nonionic infrared absorbing dyes are also preferably used.

Commercially available dyes and known dyes as described, for example, in Yuki Gosei Kagaku Kyokai ed., *Senryo Binran* (1970) may also employed. Specific examples of the dye include an azo dye, a metal complex azo dye, a pyrazolone azo dye, a naphthoquinone dye, an anthraquinone dye, a phthalocyanine dye, a carbonium dye, a quinonimine dye, a methine dye, a diimmonium dye, an aminium dye, a squarylium dye and a metal thiolate complex.

Pigments used as the sensitizing dyes include commercially available pigments and pigments described in *Colour Index (C.I.)*, Nippon Ganryo Gijutsu Kyokai ed., *Saishin Ganryo Binran* (1977), *Saishin Ganryo Oyo Gijutsu*, CMC Publishing Co. (1986) and *Insatsu Ink Gijutsu*, CMC Publishing Co. (1984). The pigments include black pigment, yellow pigment, orange pigment, brown pigment, red pigment, purple pigment, blue pigment, green pigment, fluorescent pigment, metal powder pigment and polymer-bonding dye. Specific examples of the pigment include an insoluble azo pigment, an azo lake pigment, a condensed azo pigment, a chelate azo pigment, a phthalocyanine pigment, an anthraquinone pigment, a perylene pigment, a perynone pigment, a thioindigo pigment, a quinacridone pigment, a dioxazine pigment, an isoindolinone pigment, a quinophthalone pigment, a Reichardt's dye, an azine pigment, a nitroso pigment, a nitro pigment, a natural pigment, a fluorescent pigment, an inorganic pigment and carbon black. Of the pigments, carbon black is preferably used.

The pigment may be used without a surface treatment or the pigment subjected to the surface treatment may be used. Methods of the surface treatment include coating a resin or wax on the surface of pigment, adhering a surface active agent to the surface of pigment and bonding a reactive substance (e.g., a silane coupling agent, an epoxy compound or a polyisocyanate) to the surface of pigment. The methods of surface treatment are described in *Kinzoku Sekken no Seishitu to Oyo*, Miyuki Shobo, *Insatsu Ink Gijutsu*, CMC Publishing Co. (1984) and *Saishin Ganryo Oyo Gijutsu*, CMC Publishing Co. (1986).

A particle size of the pigment is preferably from 0.01 to 10 μm, more preferably from 0.05 to 1 μm, and particularly preferably from 0.1 to 1 μm. When the particle size of pigment is less than 0.01 μm, the dispersion stability of pigment in a coating solution for the image-forming layer is inferior. On the other hand, the particle size exceeding 10 μm is not preferred in view of the uniformity of the image-forming layer.

Known dispersing techniques used in the production of ink and toner can be utilized for dispersing the pigment. A dispersing machine, for example, an ultrasonic dispersing device, a sand mill, an attriter, a pearl mill, a super mill, a ball mill, an impeller, a disperser, a KD mill, a colloid mill, Dynatron, a three-roll mill or a pressure kneader can be used for dispersion. Details thereof are described in *Saishin Ganryo Oyo Gijutsu*, CMC Publishing Co. (1986).

More preferred examples of the sensitizing dye for use in the present invention include the preferred dyes as described in JP-A-5-88372 and infrared absorbing agents as described in JPA-11-209001. The sensitizing dyes may be preferably used individually or in combination of two or more thereof.

An amount of the sensitizing dye used is ordinarily from 0 to 30% by weight, preferably from 0 to 20% by weight, and more preferably from 0 to 10% by weight, based on the total solid content of the photosensitive composition of the present invention.

(Compound Generating an Acid Upon Heat)

Into the photosensitive composition of the present invention, a compound that generates an acid upon heating (hereinafter also referred to as an "acid generator") may be incorporated. The acid generator denotes a compound that is decomposed by heating at temperature of 100° C. or above to generate an acid. The acid generated is preferably a strong acid having a pKa of not more than 2, for example, sulfonic acid or hydrochloric acid.

The acid generator preferably used in the present invention includes an onium salt, for example, an iodonium salt, a sulfonium salt, a phosphonium salt or a diazonium salt. Specific examples thereof include compounds as described in U.S. Pat. No. 4,708,925 and JP-A-7-20629. Particularly, iodonium salts, sulfonium salts and diazonium salts each having a sulfonate ion as a counter ion are preferred. Diazonium compounds as described in U.S. Pat. No. 3,867,147, diazonium compounds as described in U.S. Pat. No. 2,632,703 and diazo resins as described in JP-A-1-102456 and JP-A-1-102457 are preferably used as the diazonium salts. Benzylsulfonates as described in U.S. Pat. Nos. 5,135,838 and 5,200,544 are also preferred. Further, active sulfonic acid esters and disulfonyl compounds as described in JP-A-2-100054, JP-A-2-100055 and JP-A-9-197671 are preferably used. Moreover, S-triazines substituted with a haloalkyl group as described in JP-A-7-271029 are preferred.

The acid generator is added to the photosensitive composition of the present invention in amount of from 0.01 to 50% by weight, preferably from 0.1 to 40% by weight, and more preferably from 0.5 to 30% by weight, based on the total solid content of the photosensitive composition. When the amount of acid generator added is less than 0.01% by weight, the effect of addition is not obtained. On the other hand, when it exceeds 50% by weight, stains may occur in the non-image area at printing.

The acid generators may be used individually or in combination of two or more thereof. The acid generators described above include those decomposable by irradiation of an ultraviolet ray and thus, images can be formed on the photosensitive composition of the present invention containing such acid generators not only by an infrared ray but also by an ultraviolet ray.

(Linear Organic Polymer)

The photosensitive composition of the present invention preferably contains a linear organic polymer different from the resin containing a repeating unit corresponding to a monomer having a structure represented by formula (I), as a binder. The linear organic polymer may be any polymer as long as it is a linear organic high molecular polymer having compatibility with a polymerizable compound having a photopolymerizable unsaturated double bond. A water- or alkalescent water-soluble or swellable linear organic polymer capable of performing water development or alkalescent water development is preferably used. While the linear organic polymer is used as a film forming agent of the photosensitive composition, it is appropriately selecting depending on whether water, alkalescent water or an organic solvent is used as a developer. For example, when a water-soluble linear organic polymer is used, water development can be performed. Examples of the linear organic polymer include addition polymers having a carboxylic acid group on the side chain, for example, a methacrylic acid copolymer, an acrylic acid copolymer, an itaconic acid copolymer, a crotonic acid copolymer, a maleic acid copolymer or a partially esterified maleic acid copolymer, as described in JP-A-59-44615, JP-B-54-34327, JP-B-58-12577, JP-B-54-25957, JP-A-54-92723, JP-A-59-53836 and JP-A-59-71048. Further, acidic cellulose derivatives having a carboxylic acid group on the side chain may be used. In addition, polymers obtained by adding a cyclic acid anhydride to an addition polymer having a hydroxyl group are also useful. Of these polymers, copolymers of [benzyl(meth)acrylate/(meth) acrylic acid/other addition polymerizable vinyl monomer, if desired] and copolymers of [allyl (meth)acrylate/(meth) acrylic acid/other addition polymerizable vinyl monomer, if desired] are preferred. Moreover, polyvinyl pyrrolidone and polyethylene oxide are useful as the water-soluble linear organic polymer. In order to increase a strength of the cured film, alcohol-soluble polyamides and polyethers or 2,2-bis (4-hydroxyphenyl)propane with epichlorohydrin are also useful.

The linear organic polymer may be used in the photosensitive composition in an appropriate amount. However, if the amount exceeds 90% by weight based on the total weight of photosensitive composition, disadvantageous results may be caused in view of the strength of image formed. The amount used is preferably from 30 to 85% by weight. A weight ratio of the polymerizable compound having an unsaturated double bond described below to the linear organic polymer is preferably from 1/9 to 7/3, more preferably from 3/7 to 7/3.

The amount of the whole polymers including the resin containing a repeating unit corresponding to a monomer having a structure represented by formula (I) is ordinarily from 1 to 99.99% by weight, preferably from 5 to 90.0% by weight, and more preferably from 10 to 70% by weight, based on the total weight of the photosensitive composition.

The amount of the resin containing a repeating unit corresponding to a monomer having a structure represented by formula (I) is ordinarily from 5 to 100% by weight, preferably from 10 to 100% by weight, and more preferably from 30 to 100% by weight, based on the total weight of the whole polymers in the photosensitive composition. When the amount is less than 5% by weight, the effects of the present invention may not be achieved in some cases.

<Polymerizable Compound Having an Unsaturated Double Bond>

The polymerizable compound having an unsaturated double bond for use in the photosensitive composition of the present invention includes conventionally known polymerizable compounds having an unsaturated double bond The conventionally known polymerizable compound having an unsaturated double bond includes, for example, an ester of an unsaturated carboxylic acid (e.g., acrylic acid, methacrylic acid, itaconic acid, crotonic acid, isocrotonic acid or maleic acid) with an aliphatic polyhydric alcohol compound, and an amide of the above-described unsaturated carboxylic acid with an aliphatic polyvalent amine compound.

Specific examples of monomers, which are the esters of aliphatic polyhydric alcohol compounds with the unsaturated carboxylic acids, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, or a polyester acrylate oligomer; methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, or bis[p-(methacryloxyethoxy)phenyl]dimethylmethane; itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate, or sorbitol tetraitaconate; crotonic acid esters, for example, ethylene glycol dicrotonate, tetramethylene glycol dicrotonate, pentaerythritol dicrotonate, or sorbitol tetracrotonate; isocrotonic acid esters, for example, ethylene glycol diisocrotonate, pentaerythritol diisocrotonate, or sorbitol tetraisocrotonate; and maleic acid esters, for example, ethylene glycol dimaleate, triethylene glycol dimaleate, pentaerythritol dimaleate, or sorbitol tetramaleate. A mixture of the ester monomers is also employed. Specific examples of the of monomers, which are the amides of aliphatic polyvalent amine compounds with the unsaturated carboxylic acids, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other examples of the monomers include vinylurethane compounds having at least two polymerizable vinyl groups per molecule obtained by adding a vinyl monomer containing a hydroxyl group represented by formula (A) shown below to a polyisocyanate compound having at least two isocyanate groups in a molecule thereof as described, for example, in JP-B-48-41708 (the term "JP-B" as used herein means an "examined Japanese patent publication").

$\qquad$ (A)

wherein, R and R' each represents H or CH$_3$.

Also, urethane acrylates as described in JP-A-51-37193, polyester acrylates as described in JP-A-48-64183, JP-B-49-43191 and JP-B-52-30490, and polyfunctional acrylates and methacrylates such as epoxy acrylates obtained by reacting an epoxy resin with (meth)acrylic acid may be used. Further, photosetting monomers and oligomers as described in *Nippon Secchaku Kyoka-Shi*, Vol. 20, No. 7, pages 300 to 308 (1984) can be used. In the present invention, such a monomer may also be used in the chemical form of a prepolymer, for example, a dimer or a trimer, an oligomer, a mixture thereof, or a copolymer thereof.

An amount of the polymerizable compound having an unsaturated double bond used is ordinarily from 1 to 99.99% by weight, preferably from 5 to 90.0% by weight, and more preferably from 10 to 90% by weight, based on the total components of the photosensitive composition.

It is preferred in the present invention to incorporate a photopolymerization initiator into the photosensitive composition in order to increase the sensitivity thereof.

Preferred examples of the photopolymerization initiator includes (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

Preferred examples of the aromatic ketone (a) include compounds having a benzophenone skeleton or a thioxanthone skeleton as described in J. P. Fouassier and J. F. Rabek, *Radiation Curing in Polymer Science and Technology*, pages 77 to 117 (1993). More preferred examples of the aromatic ketone (a) include α-thiobenzophenone compounds as described in JP-B-47-6416, benzoin ether compounds as described in JP-B-47-3981, benzoin derivatives as described in JP-B-47-23664, aroylphosphonic esters as described in JP-A-57-30704, and dialkoxybenzophenones as described in JP-B-60-26483, benzoin ethers as described in JP-B-60-26403 and JP-A-62-81345, α-aminobenzophenones as described in JP-B-1-34242, U.S. Pat. No. 4,318,791 and EP-A-284,561, p-di(dimethylaminobenzoyl)benzene as described in JP-A-2-211452, thio-substituted aromatic ketones as described in JP-A-61-194062, acylphosphinesulfides as described in JP-B-2-9597, acylphosphines as described in JP-B-2-9596, specifically, thioxanthones as described in JP-B-63-61950, and coumarins as described in JP-B-59-42864.

The aromatic onium salt compound (b), which is another example of the photopolymerization initiator for use in the present invention, includes aromatic onium salts of atoms belonging to Group V, Group VI or Group VII of the periodic table, specifically, N, P, As, Sb, O, S, Se, Te, and I. Examples of the aromatic onium salt compound include compounds as described in JP-B-52-14277, JP-B-52-14278 and JP-B-52-14279.

The organic peroxide (c), which is still another example of the photopolymerization initiator for use in the present invention, includes almost all organic compounds having at least one oxygen-oxygen bond in the molecules thereof. Specific examples of the organic peroxide include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butylhydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-dimethylbenzoyl peroxide, succinic peroxide, benzoyl peroxide, 2,4-dichlorobenzoyl peroxide, metatoluoyl peroxide, diisopropylperoxy dicarbonate, di-2-ethylhexylperoxy dicabonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy-3,5,5-trimethyl hexanoate, tert-butylperoxy laurate, tert-butyl carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3', 4,4'-tetra(cumylperoxycarbonyl)benzophenone, 3,3', 4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

Of the organic peroxides, ester peroxides, for example, 3,3',4,4'-tetra(tert-butylperoxycarbonyl)benzophenone, 3,3', 4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'p-tetra(cumylperoxycarbonyl)benzophenone, 3,3',4,4'-tetra (p-isopropylcumylperoxycarbonyl)benzophenone and di-tert-butyldiperoxy isophthalate are preferred.

The thio compound (d), which is a further example of the photopolymerization initiator for use in the present invention, includes compounds represented by the following formula (II):

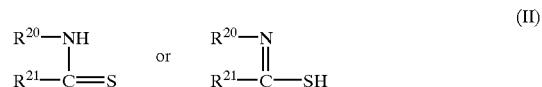

(II)

wherein R$^{20}$ represents an alkyl group, an aryl group or a substituted aryl group; R$^{21}$ represents a hydrogen atom or an alkyl group; or R$^{20}$ and R$^{21}$ combine with each other and together represent a non-metallic atomic group necessary for forming a 5-membered, 6-membered or 7-membered ring which may contain a hetero atom selected from an oxygen atom, a sulfur atom and a nitrogen atom.

The alkyl group in formula (II) is preferably that having from 1 to 4 carbon atoms. The aryl group in formula (II) is preferably that having from 6 to 10 carbon atoms, for example, phenyl and naphthyl groups. The substituted aryl group includes the above-described aryl group substituted with, for example, a halogen atom, e.g., chlorine, and an alkyl group, e.g., methyl, or an alkoxy group, e.g., methoxy or ethoxy. $R^{21}$ preferably represents an alkyl group having from 1 to 4 carbon atoms.

The hexaarylbiimidazole compound (e), which is a still further example of the photopolymerization initiator for use in the present invention, includes lophine dimers as described in JP-B-45-37377 and JF-B-44-86516.

The ketoxime ester compound (f), which is a still further example of the photopolymerization initiator for use in the present invention, includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate compound (g), which is a still further example of the photopolymerization initiator for use in the present invention, includes compounds represented by the following formula (III):

(III)

wherein $R^{22}$, $R^{23}$, $R^{24}$ and $R^{25}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, or at least two of $R^{22}$, $R^{23}$, $R^{24}$ and $R^{25}$ may combine with each other to form a cyclic structure, provided that at least one of $R^{22}$, $R^{23}$, $R^{24}$ and $R^{25}$ represents a substituted or unsubstituted alkyl group; and $Z^+$ represents an alkali metal cation or a quaternary ammonium cation.

The alkyl group represented by $R^{22}$ to $R^{25}$ includes a straight chain, branched or cyclic alkyl group, and preferably has from 1 to 18 carbon atoms. Specific examples thereof include methyl, ethyl, propyl, isopropyl, butyl, pentyl, hexyl, octyl, stearyl, cyclobutyl, cyclopentyl and cyclohexyl groups. The substituted alkyl group represented by $R^{22}$ to $R^{25}$ includes the above-described alkyl group substituted with a halogen atom (e.g., chlorine or bromine), a cyano group, a nitro group, an aryl group (e.g., phenyl), a hydroxy group, —N($R^{26}$)($R^{27}$) (wherein $R^{26}$ and $R^{27}$, which may be the same or different, each represents a hydrogen atom, an alkyl group having from 1 to 14 carbon atoms or an aryl group), —COOR$^{28}$ (wherein $R^{28}$ represents a hydrogen atom, an alkyl group having from 1 to 14 carbon atoms or an aryl group) —OCOR$^{29}$ (wherein $R^{29}$ represents an alkyl group having from 1 to 14 carbon atoms or an aryl group) or —OR$^{30}$ (wherein $R^{30}$ represents an alkyl group having from 1 to 14 carbon atoms or an aryl group). The aryl group represented by $R^{22}$ to $R^{25}$ includes an aryl group having from one to three rings, for example, phenyl or naphthyl. The substituted aryl group represented by $R^{22}$ to $R^{25}$ includes the above-described aryl group substituted with the substituent described for the substituted alkyl group above or an alkyl group having from 1 to 14 carbon atoms.

The alkenyl group represented by $R^{22}$ to $R^{25}$ includes a straight chain, branched or cyclic alkenyl group having from 2 to 18 carbon atoms. In the substituted alkenyl group, the substituent includes the substituents described for the substituted alkyl group above. The alkynyl group represented by $R^{22}$ to $R^{25}$ includes a straight chain, branched or cyclic alkynyl group having from 2 to 28 carbon atoms. In the substituted alkynyl group, the substituent includes the substituents described for the substituted alkyl group above. The heterocyclic group represented by $R^{22}$ to $R^{25}$ includes a 5-membered or more heterocyclic group, preferably a 5-membered, 6-membered or 7-membered heterocyclic group, containing at least one hetero atom selected from a nitrogen atom, a sulfur atom and an oxygen atom. The heterocyclic group may have a condensed ring. In the substituted heterocyclic group, the substituent includes the substituents described for the substituted aryl group above. Specific examples of the compound represented by formula (III) include compounds described in U.S. Pat. Nos. 3,567,453 and 4,343,891, European Patents 109,772 and 109,773.

The azinium compound (h), which is a still further example of the photopolymerization initiator for use in the present invention, includes compounds having an N—O bond as described in JP-A-63-138345, JP-A-63-142345, JP-A-63-142346, JP-A-63-143537 and Cr-B-46-42363.

The metallocene compound (i), which is a still further example of the photopolymerization initiator for use in the present invention, includes titanocene compounds as described in JP-A-59-152396, JP-A-61-151197, JP-A-63-41484, JP-A-2-249 and JP-A-2-4705, and iron-arene complexes as described in JP-A-1-304453 and JP-A-1-152109.

Specific examples of the titanocene compound include dicyclopentadienyl-Ti-dichloride, dicyclopentadienyl-Ti-biphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis -2,3,4, 5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis[2,6-difluoro-3-(pyrol-1-yl)phenyl]titanium, bis(cyclopentadienyl)bis[2,6-difluoro-3-(methylsulfonamido)phenyl]titanium, bis(cyclopentadienyl)bis[2,6-difluoro-3-(N-butylpivaloylamino)phenyl]titanium, bis(cyclopentadienyl)bis[2,6-difluoro-3-(N-ethylacetylamino)phenyl]titanium, bis(cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis(cyclopentadienyl)bis[2,6-difluoro-3-(N-ethyl-(2,2-dimethylbutanoyl)amino)phenyl]titanium, bis(cyclopentadienyl)bis[2,6-difluoro-3-(N-butyl-(2,2-dimethylbutanoyl)amino)phenyl]titanium, bis(cyclopentadienyl)bis[2,6-difluoro-3-(N-pentyl-(2,2-dimethylbutanoyl)amino)phenyl]titanium, bis(cyclopentadienyl)bis[2,6-difluoro-3-(N-hexyl-(2,2-dimethylbutanoyl)amino)phenyl]titanium, bis(cyclopentadienyl)bis[2,6-difluoro-3-(N-methylbutyrylamino)phenyl]titanium, bis(cyclopentadienyl)

bis[2,6-difluoro-3-(N-methylpentanoylamino)phenyl] titanium, bis(cyclopentadienyl)bis[2,6-difluoro-3-(N-ethylcyclohexylcarbonylamino)phenyl]titanium, bis(cyclopentadienyl)bis[2,6-difluoro-3-(N-ethylisobutyrylamino)phenyl]titanium, bis(cyclopentadienyl)bis[2,6-difluoro-3-(N-ethylacetylamino)phenyl]titanium, bis(cyclopentadienyl)bis[2,6-difluoro-3-(2,2,5,5-tetramethyl-1,2,5-azadisilazan-1-yl)phenyl]titanium, bis(cyclopentadienyl)bis[2,6-difluoro-3-(octylsulfonamido)phenyl]titanium, bis(cyclopentadienyl)bis[2,6-difluoro-2-(4-tolylsulfonamido)phenyl]titanium, bis(cyclopentadienyl)bis[2,6-difluoro-3-(4-dodecylphenylsulfonylamido)phenyl]titanium, bis(cyclopentadienyl)bis[2,6-difluoro-3-(4-(1-pentylheptyl)phenylsulfonylamido)phenyl]titanium, bis(cyclopentadienyl)bis[2,6-difluoro-3-(ethylsulfonylamido)phenyl]titanium, bis(cyclopentadienyl)bis[2,6-difluoro-3-((4-bromophenyl)-sulfonylamido)phenyl]titanium, bis(cyclopentadienyl)bis[2,6-difluoro-3-(2-naphthyl-sulfonylamido)phenyl]titanium, bis(cyclopentadienyl)bis[2,6-difluoro-3-(hexadecyl-sulfonylamido)phenyl]titanium, bis(cyclopentadienyl)bis[2,6-difluoro-3-(N-methyl-(4-dodecylphenylsulfonylamido)phenyl]titanium, bis(cyclopentadienyl)bis[2,6-difluoro-3-(N-methyl-(4-(1-pentylheptyliphenyl)sulfonylamido)phenyl]titanium, bis(cyclopentadienyl)bis[2,6-difluoro-3-(N-hexyl-(4-tolyl)sulfonylamido)phenyl]titanium, bis(cyclopentadienyl)bis[2,6-difluoro-3-(pyrrolidin-2,5-dion-1-yl)phenyl]titanium, bis(cyclopentadienyl)bis[2,6-difluoro-3-(3,4-dimethyl-3-pyrrolidin-2,5-dion-1-yl)phenyl titanium, bis(cyclopentadienyl)bis[2,6-difluoro-3-(phthalimido)-phenyl]titanium, bis(cyclopentadienyl)bis[2,6-difluoro-3-(isobutoxy-carbonylamino)phenyl]titanium, bis(cyclopentadienyl)bis[2,6-difluoro-3-(ethoxy-carbonylamino)phenyl]titanium, bis(cyclopentadienyl)bis[2,6-difluoro-3-((2-chloroethoxy)-carbonylamino)phenyl]titanium, bis(cyclopentadienyl)bis[2,6-difluoro-3-(phenoxy-carbonylamino)phenyl]titanium, bis(cyclopentadienyl)bis[2,6-difluoro-3-(3-phenyl-thioureido)phenyl]titanium, bis(cyclopentadienyl)bis[2,6-difluoro-3-(3-butyl-thioureido)phenyl]titanium, bis(cyclopentadienyl)bis[2,6-difluoro-3-(3-phenyl-ureido)phenyl]titanium, bis(cyclopentadienyl)bis[2,6-difluoro-3-(3-butyl-ureido)phenyl]titanium, bis(cyclopentadienyl)bis[2,6-difluoro-3-(N,N-diacetylamino)phenyl]titanium, bis(cyclopentadienyl)bis[2,6-difluoro-3-(3,3-dimethylureidophenyl]titanium, bis(cyclopentadienyl)bis[2,6-difluoro-3-(acetylamino)-phenyl]titanium, bis(cyclopentadienyl)bis[(2,6-difluoro-3-(butyrylamino)-phenyl]titanium, bis(cyclopentadienyl)bis[2,6-difluoro-3-(decanoylamino)-phenyl]titanium, bis(cyclopentadienyl)bis[2,6-difluoro-3-(octadecanoylamino)phenyl]titanium, bis(cyclopentadienyl)bis[2,6-difluoro-3-(isobutyrylamino)-phenyl]titanium, bis(cyclopentadienyl)bis[2,6-difluoro-3-(2-ethylhexanoyl-amino)phenyl]titanium, bis(cyclopentadienyl)bis[2,6-difluoro-3-(2-methylbutanoyl-amino)phenyl]titanium, bis(cyclopentadienyl)bis[2,6-difluoro-3-(pivaloylamino)-phenyl]titanium, bis(cyclopentadienyl)bis[2,6-difluoro-3-(2,2-dimethyl-butanoylamino)phenyl]titanium, bis(cyclopentadienyl)bis[2,6-difluoro-3-(2-ethyl-2-methyl-heptanoylamino)phenyl]titanium, bis(cyclopentadienyl)bis[2,6-difluoro-3-(cyclohexylcarbonylamino)phenyl]titanium, bis(cyclopentadienyl)bis(2,6-difluoro-3-(2,2-dimethyl-3-chloropropanoylamino)phenyl]titanium, bis(cyclopentadienyl)bis[2,6-difluoro-3-(3-phenyl-propanoylamino)phenyl]titanium, bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino)-phenyl]titanium, bis(cyclopentadienyl)bis[2,6-difluoro-3-(4-ethylbenzoyl-amino)phenyl]titanium, bis(cyclopentadienyl)bis[2,6-difluoro-3-(2,4,6-mesityl-carbonylamino)phenyl]titanium, bis(cyclopentadienyl)bis[2,6-difluoro-3-(benzoylamino)-phenyl]titanium, bis(cyclopentadienyl)bis[2,6-difluoro-3-(N-(3-phenylpropyl)-benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis(cyclopentadienyl)bis[2,6-difluoro-3-(N-isobutyl-benzoylamino)phenyl]titanium, bis(cyclopentadienyl)bis[2,6-difluoro-3-(N-cyclohexylmethylpivaloylamino)phenyl]titanium, bis(cyclopentadienyl)bis[2,6-difluoro-3-(N-(oxazolin-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl)-(4-tolyl)amino)phenyl]titanium, bis(cyclopentadienyl)bis[2,6-difluoro-3-(N-(oxolan-2-ylmethyl)-(4-tolyl)amino)phenyl]titanium, bis(cyclopentadienyl)bis[2,6-difluoro-3-(N-(4-toluylmethyl)benzoylamino)phenyl]titanium, bis(cyclopentadienyl)bis[2,6-difluoro-3-(N-(4-toluylmethyl)-(4-toluyl)amino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-butyl-(4-toluyl)amino)phenyl]titanium, bis(cyclopentadienyl)bis[2,6-difluoro-3-(N-hexyl-(4-toluyl)amino)phenyl]titanium, bis(cyclopentadienyl)bis[2,6-difluoro-3-(N-(2,4-dimethylpentyl)-2,2-dimethylbutanoylamino)phenyl]titanium, bis(cyclopentadienyl)bis[2,6-difluoro-3-(N-(2,4-dimethylpentyl)-2,2-dimethylpentanoylamino)phenyl]titanium, bis(cyclopentadienyl)bis[2,6-difluoro-3-((4-toluyl)amino)phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino)phenyl]titanium, bis(cyclopentadienyl)bis[2,6-difluoro-3-(N-cyclohexylmethylbenzoylamino)phenyl]titanium, bis(cyclopentadienyl)bis[2,6-difluoro-3-(N-cyclohexylmethyl-(4-toluyl)amino)phenyl]titanium, bis(cyclopentadienyl)bis[2,6-difluoro-3-(N-(2-ethylhexyl)benzoylamino)phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-(3-phenylpropyl)-2,2-dimethylpentanoylamino)phenyl]titanium, bis(cyclopentadienyl)bis[2,6-difluoro-3-(N- hexylbenzoylamino)phenyl]titanium, bis(cyclopentadienyl)bis[2,6-difluoro-3-(N-cyclohexylmethyl-2,2-dimethylpentanoylamino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-(2-ethylhexyl)-2,2-dimethylpentanoylamino)phenyl]titanium, bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-(3-phenylpropyl)pivaloylamino)phenyl]titanium, bis(cyclopentadienyl)bis[2,6-difluoro-3-(N-butyl-2,2-dimethylpentanoylamino)phenyl]titanium, bis(cyclopentadienyl)bis[2,6-difluoro-3-(N-(2-methoxyethyl)benzoylamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxylethyl)-(4-toluyl)amino)phenyl]titanium, bis(cyclopentadienyl)bis[2,6-difluoro-3-(N-(4-methylphenylmethyl)-2,2-dimethylpentanoylamino)phenyl]titanium, bis(cyclopentadienyl)bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-hexyl-(2-ethyl-2-methylbutanoyl)amino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxolan-2-ylmethyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoyl)amino)phenyl]titanium, bis(cyclopentadienyl)bis[2,6-difluoro-3-(3,3-dimethyl-2-azetidinon-1-yl)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropanoyl)-2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)amino)phenyl]titanium, bis(cyclopentadienyl)bis[2,6-difluoro-3-(N-butyl-(2-chloromethyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropanoyl)-(2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)amino)phenyl]titanium, bis(cyclopentadienyl)bis[2,6-difluoro-3-(N-butyl-(2-chloromethyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(methylcyclopentadienyl)bis[2,6-difluoro-3-(N-hexyl-2,2-dimethylbutanonylamino)phenyl]titanium, bis(methylcyclopentadienyl)bis[2,6-difluoro-3-(N-hexyl-2,2-dimethylpentanonylamino)phenyl]titanium, bis(methylcyclopentadienyl)bis[2,6-difluoro-3-(N-ethylacetylamino)phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanonylamino)phenyl]titanium, bis(cyclopentadienyl)bis[2,6-difluoro-3-(N-(2-methoxyethyl)trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-trimethylpropyl)dimethylsilylamino)phenyl]titanium, bis(cyclopentadienyl)bis[2,6-difluoro-3-(3-ethoxymethyl-3-methyl-2-azetidinon-1-yl)phenyl]titanium, bis(cyclopentadienyl)bis[2,6-difluoro-3-(3-allyloxymethyl-3-methyl-2-azetidinon-1-yl)phenyl]titanium, bis(cyclopentadienyl)bis[2,6-difluoro-3-(3-chloromethyl-3-methyl-2-azetidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidinon-1-yl)phenyl]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-(2,3-dihydro-1,2-benzothiazol-3-on(1,1-dioxido)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4- methylphenylmethyl-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolylsulfonylamino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylaminophenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclopentadienyl)bis[2,6-difluoro-3-(N-cyclohexylbenzoylamino)phenyl]titanium.

The active ester compound (j), which is a still further example of the photopolymerization initiator for use in the present invention, includes imidosulfonate compounds as described in JP-B-62-6223, and active sulfonates as described in JP-B-63-14340 and JP-A-59-174831.

Preferred examples of the compound having a carbon-halogen bond (k), which is a still further example of the photopolymerization initiator for use in the present invention, include the following compounds:

Compounds represented by the following formula (IV):

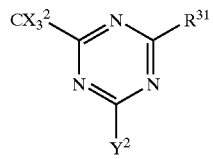

wherein $X^2$ represents a halogen atom; $Y^2$ represents $-C(X^2)_3$, $-NH_2$, $-NHR^{32}$, $-N(R^{32})_2$ or $-OR^{32}$; $R^{32}$ represents an alkyl group, a substituted alkyl group, an aryl group or a substituted aryl group; and $R^{31}$ represents $-C(X^2)_3$, an alkyl group, a substituted alkyl group, an aryl group, a substituted aryl group or a substituted alkenyl group;

Compounds represented by the following formula (V):

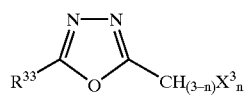

wherein $R^{33}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of from 1 to 3;

Compounds represented by the following formula (VI):

wherein $R^{34}$ represents an aryl group or a substituted aryl group; $R^{35}$ represents

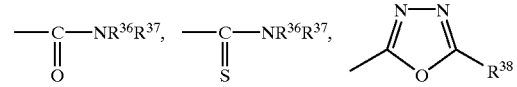

or a halogen atom; $Z^2$ represents $-C(=O)-$, $-C(=S)-$ or $-SO_2-$; $R^{36}$ and $R^{37}$ each represents an alkyl group, a substituted alkyl group, an alkenyl group, a substituted alkenyl group, an aryl group or a substituted aryl group; $R^{38}$ has the same meaning as defined for $R^{32}$ in formula (IV); $X^3$ represents a halogen atom; and m represents 1 or 2;

Compounds represented by the following formula (VII):

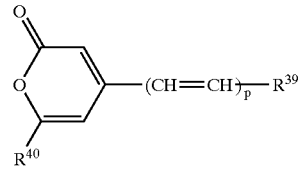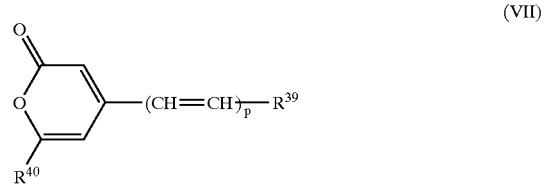

wherein $R^{39}$ represents an aryl group which may be substituted or a heterocyclic group which may be substituted; $R^{40}$ represents a trihaloalkyl or trihaloalkenyl group having from 1 to 3 carbon atoms; and p represents 1, 2 or 3;

Carbonylmethylene heterocyclic compounds having a trihalogenomethyl group represented by the following formula (VIII);

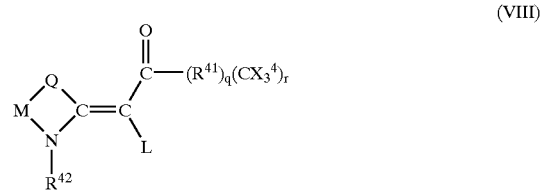

wherein L represents a hydrogen atom or a group represented by formula $-CO-(R^{41})_q(C(X^4)_3)_r$; Q represents a sulfur atom, a selenium atom, an oxygen atom, a dialkylmethylene group, an alken-1,2-ylene group, a 1,2-phenylene group or $-N-R$; M represents a substituted or unsubstituted alkylene group, a substituted or unsubstituted alkenylene group or a 1,2-arylene group; $R^{42}$ represents an alkyl group, an aralkyl group or an alkoxyalkyl group, $R^{41}$ represents a divalent carbocyclic or heterocyclic aromatic group; $X^4$ represents a chlorine atom, a bromine atom or an iodine atom; q represents 0 or 1; and r represents 1 or 2, provided that when q represents 0, r represents 1, and when q represents 1, r represents 1 or 2;

4-Halogeno-5-(halogenomethylphenyl)oxazole derivatives represented by the following formula (IX):

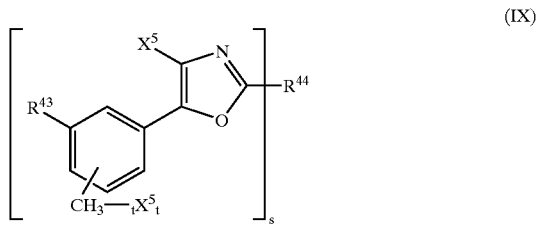

wherein $X^5$ represents a halogen atom, t represents an integer of from 1 to 3; s represents an integer of from 1 to 4; $R^{43}$ represents a hydrogen atom or $-CH_{3-t}X^5_t$; and $R^{44}$ represents an s-valent unsaturated organic residue which may be substituted; and
2-(Halogenomethylphenyl)-4-halogenooxazole derivatives represented by the following formula (X):

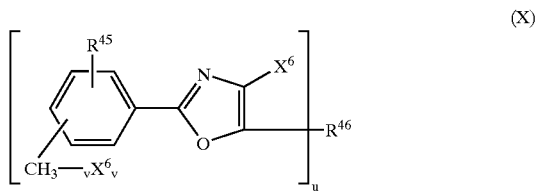

wherein $X^6$ represents a halogen atom, v represents an integer of from 1 to 3; u represents an integer of from 1 to 4; $R^{45}$ represents a hydrogen atom or $-CH_{3-v}X^6_v$; and $R^{46}$ represents an u-valent unsaturated organic residue which may be substituted.

Specific examples of the compound having a carbon-halogen bond include compounds as described in Wakabayashi et al., *Bull. Chem. Soc. Japan*, Vol. 42, page 2924 (1969), compounds as described in British Patent 1,388,492, compounds as described in JP-A-53-133428, compounds as described in German Patent 3,337,024, compounds as described in F. C. Schaefer et al., *J. Org. Chem.*, Vol. 29, page 1527 (1964), compounds as described in JPA-A-62-58241, compounds as described in JP-A-5-281728, compounds which can be easily synthesized by one skilled in the art according to synthesis methods as described in M. P. Hutt, E. F. Elslager and L. M. Herbel, *Journal of Heterocyclic Chemistry*, Vol. 7, No. 3, page 511 (1970), compounds as described in German Patent 2,641,100, compounds as described in German Patent 3,333,450, compounds as described in German Patent 3,021,590, and compounds as described in German Patent 3,021,599.

More preferred examples of the photopolymerization initiator for use in the present invention include photopolymerization initiators that generate a radical by the action of a laser beam having a wavelength of from 300 to 1,200 nm.

Still more preferred examples of the photopolymerization initiator for use in the present invention include (a) aromatic ketones, (b) aromatic onium salt compounds, (c) organic peroxides, (e) hexaarylbiimidazoles, (i) metallocene compounds and (k) compounds having a carbon-halogen bond described above, and most preferred examples include aromatic iodonium salts, aromatic diazonium salts, titanocene compounds and trihalomethyl-S-triazine compounds represented by formula (IV).

The photopolymerization initiators for use in the present invention are suitably used individually or in combination of two or more thereof.

Sensitizing dye which may constitute one component of the photosensitive composition of the present invention include a spectral sensitizing dye and a dye or pigment which absorbs light of a light source and interacts with the photopolymerization initiator.

Preferred examples of the spectral sensitizing dye or dye include polynuclear aromatic compounds (e.g., pyrene, perylene or triphenylene), xanthenes (e.g., Fluorescein, Eosine, Erythrocin, Rhodamine B or Rose Bengale), cyanines (e.g., thiacarbocyanine or oxacarbocyanine), merocyanines (e.g., merocyanine or carbomerocyanine), thiazines (e.g., Thionine Blue, Methylene Blue or Toluidine blue), acridines (e.g., Acridine Orange, chloroflavine or acriflavine), phthalocyanines (e.g., phthalocyanine or metallo-phthalocyanine), porphyrins (e.g., tetraphenyl porphyrin or center metal-substituted porphyrin), chlorophylls (e.g., chlorophyll, chlorophyllin or center metal-substituted chlorophyll), metal complexes, anthraquinones (e.g., anthraquinone), and squaryliums (e.g., squarylium).

More preferred examples of the spectral sensitizing dye or dye include styryl dyes as described in JP-B-37-13034, cationic dyes as described in JP-A-62-143044, quinoxalinium salts as described in JP-B-59-24147, new Methylene Blue compounds as described in JP-A-64-33104, anthraquinones as described in JP-A-64-56767, benzoxanthene as dyes described in JP-A-2-1714, acridines as described in JP-A-2-226148 and JP-A-2-226149, pyrylium salts as described in JP-B-40-28499, cyanines as described in JP-B-46-42363, benzofuran dyes as described in JP-A-2-63053, conjugated ketone dyes as described in JP-A-2-85858 and JP-A-2-216154, dyes as described in JP-A-57-10605, azocinnamylidene derivatives as described in JP-B-2-30321, cyanines as described in JP-A-1-287105, xanthene dyes as described in JP-A-62-31844, JP-A-62-31848 and JP-A-62-143043, aminostyryl ketones as described in JP-B-59-28325, merocyanine dyes as described in JP-B-61-9621, dyes described in JP-A-2-179643, merocyanine dyes as described in JP-A-2-244050, merocyanine dyes as described in JP-B-59-28326, merocyanine dyes as described in JP-A-59-89303, merocyanine dyes as described in JP-A-8-129257, and benzopyran dyes as described in JP-A-8-334897.

In addition, the infrared absorbing dyes (including dyes and pigments) described hereinbefore as the sensitizing dyes are also preferably used.

More preferred examples of the sensitizing dye for use in the present invention include the merocyanine dyes described in JP-B-61-9621, the merocyanine dyes described in JP-A-2-179643, the merocyanine dyes described in JP-A-2-244050, the merocyanine dyes described in JP-B-59-28326, the merocyanine dyes described in JP-A-59-89303, the merocyanine dyes described in JP-A-8-129257, and benzopyran dyes described in JP-A-8-334897.

Furthermore, the infrared absorbing agents described in JP-A-11-209001 may also be used.

The sensitizing dyes may be suitably employed individually or as a combination of two or more thereof in the present invention. In the photosensitive composition according to the present invention, known compounds which function for further increasing sensitivity or preventing the polymerization inhibition due to oxygen may be incorporated as cosensitizers.

Examples of the cosensitizer include amine compounds as described in M. R. Sander, *Journal of Polymer Society*, Vol., 10, page 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825, and specifically triethanolamine, ethyl p-dimethylaminobenzoate, p-formyldimethylaniline and p-methylthiodimethylaniline.

Other examples of the cosensitizer include thiol compounds as described in JP-A-53-702, JP-B-55-50806 and JP-A-5-142772, and disulfide compounds as described in JP-A-56-75643, and specifically 2-mercaptobenzothiazole, 2-mercaptobenzoxazole, 2-mercaptobenzimidazole, 2-mercapto-4(3H)-quinazoline and β-mercaptonaphthalene.

Still other examples of the cosensitizer include amino acid compounds (e.g., N-phenylglycine), organometal compounds (e.g., tributyl tin acetate) as described in JP-B-48-42965, hydrogen donors as described in JP-B-55-34414, sulfur compounds (e.g., trithiane) as described in JP-A-6-308727, phosphorus compounds (e.g., diethylphosphite) as described in JP-A-6-250389, and Si—H or Ge—H compounds.

The amount of photopolymerization initiator used is preferably from 0.01 to 60% by weight, and more preferably form 0.05 to 30% by weight, based on the amount of the whole component of photosensitive composition according to the present invention.

When a sensitizing dye is used in the present invention, a molar ratio of the photopolymerization initiator to the sensitizing dye in the photosensitive composition is preferably from 99:1 to 1:99, more preferably from 90:10 to 10:90, and particularly preferably from 80:20 to 20:80.

In case of using the cosensitizer, the amount thereof is preferably from 0.01 to 50 parts by weight, more preferably from 0.02 to 20 parts by weight, and particularly preferably from 0.05 to 10 parts by weight per part by weight of the photopolymerization initiator.

(Stabilizing Agent)

According to the present invention, it is preferred that a small amount of a thermal polymerization inhibitor is added to the photosensitive composition in order to prevent undesirable thermal polymerization of the polymerizable compound having a polymerizable unsaturated double bond during the production and preservation of the photosensitive composition, in addition to the fundamental components described above. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butyl-phenol) and N-nitrosophenylhydroxylamine primary cerium salt. An amount of the thermal polymerization inhibitor added is preferably from about 0.01 to about 5% by weight based on the total solid content of the photosensitive composition. Also, if desired, a higher fatty acid derivative, for example, behenic acid or behenic acid amide may be added so as to be maldistributed on the surface of a photosensitive layer during the drying process after the coating of the photosensitive composition in order to prevent the polymerization inhibition due to oxygen. An amount of the higher fatty acid derivative added is preferably from about 0.5 to about 10% by weight based on the total solid content of the photosensitive composition.

(Coloring Agent)

Further, a dye or a pigment may be added for the purpose of coloring the photosensitive layer. By the addition of coloring agent, a printing plate can be improved in plate inspection properties, for example, visibility after the plate making or suitability for image density measurement. The coloring agent used is preferably a pigment because many dyes cause reduction in the sensitivity of the photopolymerizable photosensitive layer. specific examples of the coloring agent include pigments, for example, a phthalocyanine pigment, an azo pigment, carbon black or titanium oxide, and dyes, for example, Ethyl Violet, Crystal Violet, an azo dye, an anthraquinone dye or a cyanine dye. An amount of the dye or pigment added is preferably from about 0.5 to about 5% by weight based on the total solid content of the photosensitive composition.

(Other Additives)

Known other additives, for example, an inorganic filler or a plasticizer for improving physical properties of the cured film, or an oil sensitivity imparting agent capable of improving an ink-receptive property on the surface of photosensitive layer, may also be added to the photosensitive composition.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. The plasticizer may be added in an amount of not more than 10% by weight based on the total solid content of the photosensitive composition.

Furthermore, in order to improve the film strength (printing durability), an UV initiator or a heat crosslinking agent capable of accelerating the effect of heating and/or exposure to light after the development may also be added.

In addition, in order to improve adhesion between the photosensitive layer and a support or to increase removability of the unexposed photosensitive layer by development, an additive may be added or an interlayer may be provided. For instance, by adding or undercoating a compound having a relatively strong interaction with the support, for example, a compound having a diazonium structure or a phosphone compound, the adhesion to the support can be improved, thereby increasing the printing durability. On the other hand, by adding or undercoating a hydrophilic polymer, for example, polyacrylic acid or polysulfonic acid, the developability of the non-image area can be improved, whereby resistance to stain can be increased.

The photosensitive composition of the present invention is dissolved in an appropriate solvent selected from various solvents and the resulting solution is coated on a support. Examples of the solvent which can be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or in combination of two or more thereof. The solid concentration in the coating solution is suitably from 2 to 50% by weight.

Since the amount of coverage of photosensitive layer on a support has an influence mainly upon the sensitivity of photosensitive layer, the developability, the strength of the exposed film and the printing durability, it is desirable to appropriately determine the amount of coverage depending on the use. When the amount of coverage is too small, the printing durability may not be sufficient, whereas an excessively large amount of coverage is disadvantageous, because the sensitivity decreases, the exposure takes a time and the development also requires a longer period of time. In the case of a lithographic printing plate for scanning exposure, which is one of the main objects of the present invention, the amount of coverage is preferably from about 0.1 to about 10 g/m$^2$, more preferably from 0.5 to 5 g/m$^2$, in terms of the dry weight.

<Support>

For preparing a lithographic printing plate, which is one of the main objects of the present invention, the photosensitive layer is preferably provided on a support having a hydrophilic surface. For such purpose, any known hydrophilic support used for a lithographic printing plate may be employed without any limitation. The support employed is preferably a dimensionally stable plate-like material. Examples thereof include paper, paper laminated with plastics (e.g., polyethylene, polypropylene or polystyrene), a plate of metal (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film laminated with or having deposited thereon the above-described metal. The surface of the support may be subjected to a known appropriate physical or chemical treatment, if desired, for the purposes, for example, imparting hydrophilicity or increasing strength.

Paper, a polyester film and an aluminum plate are preferably used. Of the supports, the aluminum plate is particularly preferred because it is dimensionally stable, relatively inexpensive and capable of providing a surface excellent in the hydrophilicity and strength by a surface treatment, if desired. Also, a composite sheet obtained by bonding an aluminum sheet on a polyethylene terephthalate film as described in JP-B-48-18327 is preferably used.

The aluminum plate suitably used includes a pure aluminum plate or an alloy plate mainly comprising aluminum and containing a trace amount of foreign elements. Also, a plastic film laminated with or having deposited thereon aluminum may be used. Examples of the foreign element contained in the aluminum alloy include silicon, iron, manganese, copper, magnesium, chromium, zinc, bismuth, nickel and titanium. The content of foreign elements in the alloy is at most 10% by weight. In the present invention, although pure aluminum is particularly suitably used, it is difficult to produce completely pure aluminum in view of the refining technology. Thus, an aluminum containing a trace amount of foreign elements can be used. The composition of the aluminum plate for use in the present invention is not particularly limited and an aluminum plate conventionally known and used in the field of art can be appropriately utilized. The aluminum plate for use in the present invention preferably has a thickness of approximately from 0.1 to 0.6 mm, more preferably from 0.15 to 0.4 mm, and still more preferably from 0.2 to 0.3 mm.

In case of a support having a metal surface, particularly an aluminum surface, the support is preferably subjected to a surface treatment, for example, a surface roughening (graining) treatment, an immersion treatment in an aqueous solution of sodium silicate, potassium fluorozirconate or a phosphate, or an anodic oxidation treatment.

The surface roughening treatment of aluminum plate is performed by various methods, for example, by a method of mechanically roughening the surface, a method of electrochemically dissolving and roughening the surface or a method of chemically dissolving selectively the surface. In the mechanical surface roughening, a known method, for example, ball graining, brush graining, blast graining or buff graining may be used. The electrochemical surface roughening includes a method of transporting an aluminum plate in an electrolytic solution, e.g., hydrochloric acid or nitric acid while applying an alternating current or direct current. Also, a method wherein these two surface roughening treatments may be conducted in combination may be used as described in JP-A-54-63902. Prior to the surface roughening of aluminum plate, the aluminum plate is subjected to a degreasing treatment, for example, with a surface active agent, an organic solvent or an alkaline aqueous solution, if desired, for the purpose of removing rolling oil on the surface thereof.

Further, an aluminum plate subjected to the surface roughening treatment and then to an immersion treatment in an aqueous sodium silicate solution may be preferably used. An aluminum plate subjected to an anodic oxidation treatment and then to an immersion treatment in an aqueous solution of alkali metal silicate as described in JP-B-47-5125 is preferably used. The anodic oxidation treatment is carried out by applying an electric current to the aluminum plate as an anode in an electrolytic solution, for example, in an aqueous or non-aqueous solution of an inorganic acid, e.g., phosphoric acid, chromic acid, sulfuric acid or boric acid, an organic acid, e.g., oxalic acid or sulfamic acid, or a salt thereof. The aqueous or non-aqueous solutions may be used individually or in combination of two or more thereof.

The silicate electrodeposition as described in U.S. Pat. No. 3,658,662 is also effective.

Also, a support subjected to electrolytic graining as described in JP-B-46-27481, JP-A-52-58602 and JP-A-52-30503 and to the above-described anodic oxidation treatment and sodium silicate treatment in combination is useful.

A support subjected to mechanical graining, chemical etching, electrolytic graining, anodic oxidation treatment and sodium silicate treatment in order as described in JP-A-56-28893 is also preferably used.

Further, a support subjected to, after the above-described treatments, an undercoat treatment with a water-soluble resin, for example, polyvinyl phosphonic acid, a polymer or copolymer having a sulfonic acid group in the side chain thereof or polyacrylic acid, a water-soluble metal salt (e.g., zinc borate), a yellow dye or an amine salt is preferably used.

A support subjected to a sol-gel treatment and having covalent-bonded thereto a functional group capable of causing an addition reaction by a radical as described in JP-A-7-159983 is also preferably used.

Other preferred examples include a support obtained by providing a water-resistant hydrophilic layer as a surface layer on a support. Examples of the surface layer include a layer comprising an inorganic pigment and a binder as described in U.S. Pat. No. 3,055,295 and JP-A-56-13168, a hydrophilic swellable layer as described in JP-A-9-80744, and a sol-gel film comprising titanium oxide, polyvinyl alcohol and a silicic acid as described in JP-W-8-507727 (the term "JP-W" as used herein means an "unexamined published international patent application").

The hydrophilic treatment is applied for the purpose of, for example, preventing a detrimental reaction in the photosensitive composition coated thereon or improving the adhesion of the photosensitive layer, in addition to the purpose of rendering the support surface hydrophilic.

<Protective Layer>

In the present invention, the lithographic printing plate for scanning exposure is usually exposed in the air, therefore, a protective layer may be further provided on the photosensitive composition layer. The protective layer prevents a low molecular substance, e.g., a basic substance present in the air, which inhibits the image formation reaction caused in the photosensitive layer upon exposure, from penetrating into the photosensitive layer and thereby enables the exposure in the air. Accordingly, the protective layer is required to have low permeability to a low molecular substance and preferably further has capabilities of not substantially inhibit the transmission of light used for the exposure, exhibiting excellent adhesion to the photosensitive layer and being easily removed in a development step after the exposure. Investigations on the protective layer have been made as described in detail in U.S. Pat. No. 3,458,311 and JP-A-55-49729. Examples of the material which can be used in the protective layer include a water-soluble polymer compound having relatively good crystallinity. Specific examples thereof include a water-soluble polymer, for example, polyvinyl alcohol, polyvinyl pyrrolidone, acidic cellulose, gelatin, gum arabic or polyacrylic acid. Particularly, polyvinyl alcohol is preferably used as the main component because most advantageous results in the fundamental properties such as oxygen inhibiting property and development removability can be obtained. The polyvinyl alcohol for use in the protective layer has necessary oxygen inhibiting property and water solubility, therefore, as long as it contains an unsubstituted vinyl alcohol unit, a part may be displaced with an ester, an ether or an acetal. Similarly, a part may have another copolymer component. Examples of the polyvinyl alcohol which can be used include those having a hydrolysis ratio of from 71 to 100 mol % and a weight average molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components of the protective layer (e.g., selection of FVA or use of additives) and the coating amount thereof are determined by taking account of fogging property, adhesive property and scratch resistance, in addition to the inhibiting property against the low molecular substance and the development removability. In general, PVA having a higher hydrolysis ratio (namely, the protective layer has a higher unsubstituted vinyl alcohol unit content) and the layer thickness is larger, the low molecular substance inhibiting property becomes stronger and this is more advantageous in view of sensitivity. However, if the low molecular substance inhibiting property is extremely increased, the undesirable polymerization reaction may be caused during the production or preservation, or the undesirable fog or thickening of image line may be generated at the image exposure. Further, the adhesive property to the image area and the scratch resistance are also very important in view of handling of the plate. Specifically, when a hydrophilic layer comprising a water-soluble polymer is coated on a lipophilic polymer layer, the layer is readily peeled off due to insufficient adhesion. To overcome such a problem, various proposals have been made to improve the adhesive property between those two layers. For example, in U.S. patent application Ser. Nos. 292,501 and 44,563, there are described techniques of mixing from 20 to 60% by weight of an acrylic emulsion or a water-insoluble vinyl pyrrolidone-vinyl acetate copolymer in a hydrophilic polymer mainly comprising polyvinyl alcohol and applying the mixture to the lipophilic polymer layer, thereby obtaining a sufficiently high adhesive property. These known techniques can be applied to the protective layer for use in the present invention. A coating method of the protective layer is described in detail, for example, in U.S. Pat. No. 3,458,311 and JP-A-55-49729.

Furthermore, other functions may be imparted to the protective layer. For instance, when a laser ray is used as the light source, the photosensitive composition is intended to exhibit excellent sensitivity to light at the wavelength of the light source but not sensitive to light at other wavelengths. In a case where the light source emits light in an infrared region of 750 nm or more, the printing plate may be used substantially in a bright room. In some cases, however, the printing plate is also practically sensitive to light having a short wavelength, e.g., light of a fluorescent lamp. In such a case, a coloring agent (erg., water-soluble dye) ensuring excellent transmittance of light of the light source and capable of efficiently absorbing light at a wavelength of less than 700 nm is preferably added.

In another example where a light source which emits light in the ultraviolet region of 450 nm or less is used, the printing plate can be substantially used under a safe light. However, in some cases, the printing plate is also sensitive to visible light of 500 nm or more. In such a case, a coloring agent (e.g., water-soluble dye) ensuring excellent transmission of light of the light source and capable of efficient absorbing light at a wavelength of 500 nm or more may be used, whereby the safelight aptitude can be more improved without causing any reduction in the sensitivity.

In case of using a photosensitive material prepared by employing the photosensitive composition of the present invention as an image-forming material, the photosensitive material is usually subjected to imagewise exposure and then developed with a developer to remove the unexposed area of the photosensitive layer, thereby forming an image. A developer, which is preferably used for the development of the photosensitive layer to prepare a lithographic printing plate, includes a developer as described in JP-B-57-7427. An aqueous solution of an inorganic alkali agent, e.g., sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent, e.g., monoethanolamine or diethanolamine is suitably used. The alkali agent is added so that a concentration of the alkali agent in the solution is ordinarily from 0.1 to 10% by weight, preferably from 0,5 to 5% by weight.

The alkaline aqueous solution may contain, if desired, a small amount of a surface active agent or an organic solvent, for example, benzyl alcohol, 2-phenoxyethanol or 2-butoxyethanol, Examples of such alkaline aqueous solution include those described in U.S. Pat. Nos. 3,375,171 and 3,615,480.

Further, developers as described in JP-A-50-26601, JP-A-58-54341, JP-B-56-39464 and JP-B-56-42860 are also excellent.

In the plate-making process of a lithographic printing plate precursor to which the photosensitive composition of the present invention is suitably applied, the entire surface of lithographic printing plate precursor may be heated, if desired, before or during the exposure or in the period from the exposure to the development. By the heating, the image-forming reaction in the photosensitive layer is accelerated, and advantageous effects, for example, improvement in the sensitivity and the printing durability or stabilization of the sensitivity can be obtained. Furthermore, for the purpose of improving the image strength and the printing durability, it is also effective to conduct after-heating or exposure to the entire surface of the image after the development. It is preferred that the heating before the exposure is conducted under a mild condition as a temperature of 150° C. or below. If the temperature is excessively high, a problem in that fog occurs in the non-image area may arise. In the heating after the development, a very severe condition as a temperature of from 200 to 500° C. is usually used. When the temperature is low, a sufficient effect of strengthening the image may not be obtained, whereas when it is excessively high, a problem, for example, deterioration of the support or thermal decomposition of the image area may arise.

In a scanning exposure of the lithographic printing plate according to the present invention, known methods may be used without any limitation. The light source used is preferably a laser. Examples of the laser light source having a wavelength of from 350 to 450 nm available at present, which can be used, include the followings:

gas laser, for example, Ar ion laser (364 nm, 351 nm, from 10 mW to 1 W), Kr ion laser (356 nm, 351 nm, from 10 mW to 1 W) or He—Cd laser (441 nm, 325 nm, from 1 to 100 mW);

solid laser, for example, a combination of Nd:YAG (YVO$_4$) with SHG crystal×twice (355 nm, from 5 mW to 1 W) or a combination of Cr:LiSAF and SHG crystal (430 nm, 10 mw);

semiconductor laser, for example, KNbO$_3$, ring resonator (430 nm, 30 mW), a combination of a waveguide type wavelength conversion element with AlGaAs or InGaAs semiconductor (from 380 to 450 nm, from 5 to 100 mW), a combination of a waveguide type wavelength conversion element with AlGaInP or AlGaAs semiconductor (from 300 to 350 nm, from 5 to 100 mW),or AlGaInN (from 350 to 450 nm, from 5 to 30 mW); and pulse laser, for example, N$_2$ laser (337 nm, pulse: from 0.1 to 10 mJ) or XeF (351 nm, pulse: from 10 to 250 mJ).

Of these lasers, the AlGaInN semiconductor laser (commercially available InGaN-type semiconductor laser: from 400 to 410 nm, from 5 to 30 mW) is preferred in view of the wavelength property and the cost.

In addition, as the available light source which emits light of from 450 to 700 nm, Ar+ laser (488 nm), YAG-SHG laser (532 nm), He—Ne laser (633 nm), He—Cd laser and red semiconductor laser (from 650 to 690 nm) may be suitably used, and as the available light source which emits light of from 700 to 1,200 nm, semiconductor laser (from 800 to 850 nm) and Nd-YAG laser (1,064 nm) may be suitably used.

Furthermore, various mercury lamps of ultrahigh pressure, high pressure, medium pressure and low pressure, a chemical lamp, a carbon arc lamp, a xenon lamp, a metal halide lamp, an ultraviolet laser lamp (e.g., ArF excimer laser or KrF excimer laser) and a radiation, for example, an electron beam, an X ray, an ion beam or a far infrared ray may be used. The laser light sources of 350 nm or more are preferred because these are inexpensive.

The exposure mechanism may be any of an internal surface drum system, an external drum system and a flat bed system.

The components of the photosensitive layer for use in the present invention may have high water solubility and thereby the photosensitive layer may be rendered to be soluble in neutral water or alkalescent water. A lithographic printing plate precursor having such a photosensitive layer can be mounted on a printing machine and performed exposure and development on the machine.

The photosensitive composition according to the present invention is widely applied to known uses of photosetting resins without any particular restriction, in addition to the use of lithographic printing plate for scanning exposure. For instance, the liquid photosensitive composition further containing a cation polymerizable compound, if desired, is used as a material for stereolithography having high sensitivity. The photosensitive composition is used as a material for holography utilizing the change of refractive index due to photopolymerization. It is also applied to various transfer materials (for example, a peeling type photosensitive material or a toner development type photosensitive material) utilizing the change of adhesion on the surface due to photopolymerization. Further, it is applied to photocuring of microcapsules. Moreover, it is applied to the production of materials for electronics, for example, photoresists, and photosetting resin materials, for example, ink, paint and adhesives.

The present invention will be described in greater detail with reference to the following examples, but the present invention should not be construed as being limited thereto.

<General Synthesis Method of Polymer>

Synthesis of the polymer for use in the present invention can be conducted by polymerization of the monomer having a structure represented by formula (I) or copolymerization of the monomer together with a known monomer. Synthesis methods of the monomer are described in JP-A-2001-92127.

(Preparation of Support)

A 0.3 mm-thick aluminum plate was etched by dipping it in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic graining treatment in a 1% by weight aqueous nitric acid solution using an alternating current with a sinusoidal waveform at electricity of 300 coulomb/dm$^2$ during the anodic time. Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to conduct a desmut treatment, and then subjected to an anodic oxidation treatment in a 20% by weight aqueous sulfuric acid solution for 2 minutes at a current density of 2 A/dm$^2$ to form an anodic oxide film having a thickness of 2.7 g/m$^2$. The surface roughness measured was 0.3 μm (the Ra value according to JIS B0601).

On the back surface of the thus-treated aluminum plate, a coating solution for backcoat layer described below was coated by a bar coater and dried at 100° C. for 1 minute, thereby preparing a support having provided thereon the backcoat layer having a dry coating amount of 70 mg/m$^2$.

| Sol-gel reaction solution | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and about 5 minutes later, heat generation occurred. After reacting the mixture for 60 minutes, a solution having the composition shown below was added the reaction mixture to prepare the coating solution for backcoat layer.

| | |
|---|---|
| Pyrogallol formaldehyde condensed resin (molecular weight: 2,000) | 4 parts by weight |
| Dimethyl phthalate | 5 parts by weight |
| Fluorine surface active agent (N-butylperfluorooctane sulfonamidoethyl acrylate/polyoxyethylene acrylate copolymer, molecular weight: 20,000) | 0.7 parts by weight |
| Methanol silica sol (produced by Nissan Chemical Industries, Ltd., 30% by weight in methanol) | 50 parts by weight |
| Methanol | 800 parts by weight |

(Preparation of Photosensitive Layer)

On the above-described aluminum support, a coating solution for photosensitive layer having the composition shown below was coated and dried at 100° C. for 1 minute to form a photosensitive layer having a dry coating amount of 1.5 g/m$^2$, thereby preparing a photosensitive material.

| Solution for photosensitive layer | |
|---|---|
| Polymer (X) of the present invention or for comparison shown in Table A below | 2.0 g |
| Compound (Y) crosslikable with Polymer (X) shown in Table A below | 2.0 g |
| Sensitizing dye (Z) shown in Table A below below | 0.2 g |
| Acid generator (A) shown in Table A below below | 0.2 g |
| Coloring agent (B) shown in Table A below below | 0.1 g |
| Stabilizing agent (C) shown in Table A below | 0.01 g |
| Fluorine surface active agent (Megafac F-177, produced by Dai-Nippon Ink & Chemicals, Inc.) | 0.03 g |
| Methyl ethyl ketone | 20 g |
| 1-Methoxy-2-propanol | 20 g |

(Evaluation of Printing Durability)

Each photosensitive material was subjected to scanning exposure (exposure amount: 100 mJ/cm$^2$) using a laser responding to the photosensitive material to form a 1% dot image (highlight), a heat treatment by a panel heater at 150° C. for 60 seconds and development with a developer shown below. The printing plate thus-obtained was subjected to printing using a printing machine (Hydel KOR-D) and a number of printed matters free from image degradation was determined. The number of printed matters for each printing plate was relatively compared using a printing durability index when the number of printed matters of Example 1 is taken as 200. The larger the index, the better the printing durability. The results obtained are shown in Table B below.

| Composition of developer | |
|---|---|
| DP-4 (produced by Fuji Photo Film Co., Ltd.) | 65.0 g |
| Water | 880.0 g |
| Lipomin LA (20% aqueous solution, produced by Lion Corp.) | 50.0 g |

(Evaluation of Preservation Stability)

Each of the photosensitive material before the laser exposure was allowed to stand under a high temperature condition (60° C.) for 3 days, and then subjected to the laser exposure in the same manner as above. The amount of energy necessary for imaging was determined and an energy ratio between before and after the preservation at a high temperature (energy after high temperature preservation/energy before high temperature preservation) was obtained. The energy ratio of not more than 1.1 is preferable in the production and denotes excellent preservation stability. The results obtained are also shown in Table B below.

TABLE A

Photosensitive Material

| Example | X | Y | Z | A | B | C | Exposure Light Source (nm) |
|---|---|---|---|---|---|---|---|
| 1 | P1-1 | none | Z-1 | none | B-1 | C-1 | 351 |
| 2 | P1-5 | none | Z-1 | none | B-1 | C-1 | 351 |
| 3 | P1-8 | Y-1 | Z-1 | none | B-2 | C-1 | 351 |
| 4 | P2-1 | Y-2 | none | none | B-1 | none | 351 |
| 5 | P2-6 | Y-2 | none | none | B-2 | none | 351 |
| 6 | P2-10 | Y-3 | none | none | B-2 | none | 351 |
| 7 | P3-1 | Y-4 | none | A-1 | B-1 | none | 351 |
| 8 | P3-8 | Y-5 | none | A-2 | B-1 | none | 351 |
| 9 | P3-12 | Y-6 | none | A-1 | B-1 | none | 351 |
| 10 | P1-2 | none | Z-2 | none | B-1 | C-1 | 830 |
| 11 | P1-4 | none | Z-3 | none | B-1 | C-1 | 830 |
| 12 | P2-3 | Y-2 | Z-2 | none | B-1 | none | 830 |
| 13 | P2-11 | Y-2 | Z-3 | none | B-2 | none | 830 |
| 14 | P3-2 | Y-3 | Z-3 | A-1 | B-1 | none | 830 |
| 15 | P3-5 | Y-4 | Z-3 | A-2 | B-2 | none | 830 |
| 16 | P3-9 | Y-4 | Z-2 | A-2 | B-1 | none | 830 |
| 17 | P3-10 | Y-5 | Z-2 | A-1 | B-2 | none | 830 |

Comparative Example

| | X | Y | Z | A | B | C | Exposure Light Source (nm) |
|---|---|---|---|---|---|---|---|
| 1 | X-1 | none | Z-1 | none | B-1 | C-1 | 351 |
| 2 | X-2 | none | Z-1 | none | B-1 | C-1 | 351 |
| 3 | X-3 | Y-1 | Z-1 | none | B-2 | C-1 | 351 |
| 4 | X-4 | Y-2 | none | none | B-1 | none | 351 |
| 5 | X-5 | Y-2 | none | none | B-2 | none | 351 |
| 6 | X-6 | Y-3 | none | none | B-2 | none | 351 |
| 7 | X-7 | Y-4 | none | A-1 | B-1 | none | 351 |
| 8 | X-8 | Y-5 | none | A-2 | B-1 | none | 351 |
| 9 | X-9 | Y-6 | none | A-1 | B-1 | none | 351 |
| 10 | X-10 | none | Z-2 | none | B-1 | C-1 | 830 |
| 11 | X-11 | none | Z-3 | none | B-1 | C-1 | 830 |
| 12 | X-12 | Y-2 | Z-2 | none | B-1 | none | 830 |
| 13 | X-13 | Y-2 | Z-3 | none | B-2 | none | 830 |
| 14 | X-14 | Y-3 | Z-3 | A-1 | B-1 | none | 830 |
| 15 | X-15 | Y-4 | Z-3 | A-2 | B-2 | none | 830 |
| 16 | X-16 | Y-4 | Z-2 | A-2 | B-1 | none | 830 |
| 17 | X-17 | Y-5 | Z-2 | A-1 | B-2 | none | 830 |

TABLE B

Evaluation Result

| Example | Printing Durability Index | Preservation Stability |
|---|---|---|
| 1 | 200 | 1.1 |
| 2 | 200 | 1.1 |
| 3 | 200 | 1.1 |
| 4 | 180 | 1.05 |
| 5 | 200 | 1.05 |
| 6 | 200 | 1.1 |
| 7 | 200 | 1.0 |
| 8 | 180 | 1.0 |
| 9 | 200 | 1.0 |
| 10 | 180 | 1.1 |
| 11 | 180 | 1.05 |
| 12 | 200 | 1.1 |
| 13 | 200 | 1.1 |
| 14 | 200 | 1.05 |
| 15 | 200 | 1.0 |
| 16 | 180 | 1.0 |
| 17 | 180 | 1.0 |

| Comparative Example | Printing Durability Index | Preservation Stability |
|---|---|---|
| 1 | 120 | 1.5 |
| 2 | 120 | 1.5 |
| 3 | 120 | 1.5 |
| 4 | 120 | 2.0 |
| 5 | 130 | 1.5 |
| 6 | 130 | 1.5 |
| 7 | 100 | 1.5 |
| 8 | 120 | 1.5 |
| 9 | 120 | 1.5 |
| 10 | 90 | 1.5 |
| 11 | 120 | 1.5 |
| 12 | 100 | 1.5 |
| 13 | 110 | 2.0 |
| 14 | 100 | 2.0 |
| 15 | 110 | 1.5 |
| 16 | 110 | 1.5 |
| 17 | 120 | 1.5 |

Compounds Described in Table A

X-1: copolymer of $-(CH_2C(CH_3))_{30}-$ with $CO_2CH_3$ and $-(CH_2C(CH_3))_{50}-$ with $CO_2-(CH_2)_5-N$ (dimethylmaleimide); and $-(CH_2C(CH_3))_{20}-$ with $CO_2H$; $\overline{M}w$ 60000

X-2: copolymer of $-(CH_2C(CH_3))_{80}-$ with $CO_2-(CH_2)_5-N$ (dimethylmaleimide) and $-(CH_2C(CH_3))_{20}-$ with $CO_2H$; $\overline{M}w$ 80000

X-3: copolymer of $-(CH_2C(CH_3))_{60}-$ with $CO_2-(CH_2)_5-N$ (dimethylmaleimide) and $-(CH_2C(CH_3))_{40}-$ with $CO_2H$; $\overline{M}w$ 60000

X-4: copolymer of $-(CH_2C(CH_3))_{90}-$ with $CO_2-CH_2CH_2OH$ and $-(CH_2C(CH_3))_{10}-$ with $CO_2H$; $\overline{M}w$ 100000

X-5: copolymer of $-(CH_2CH)_{80}-$ with $CN$ and $-(CH_2C(CH_3))_{20}-$ with $CO_2H$; $\overline{M}w$ 60000

X-6: copolymer of $-(CH_2C(CH_3))_{50}-$ with $CO_2-CH_2CH_2OH$ and $-(CH_2C(CH_3))_{30}-$ with $CO_2-(CH_2)_3CN$ -continued
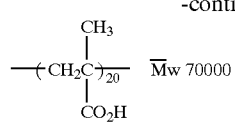
X-7
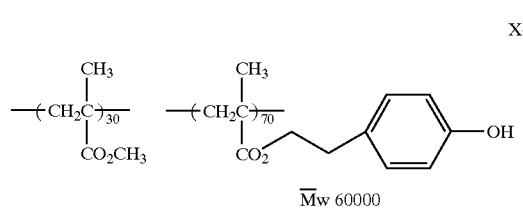
X-8
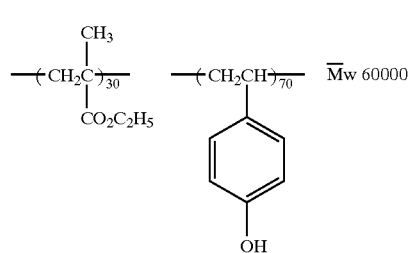
X-9
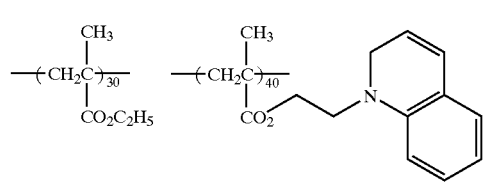
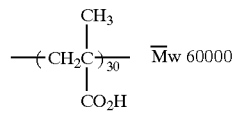
X-10
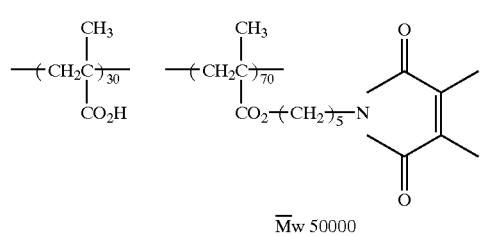
X-11
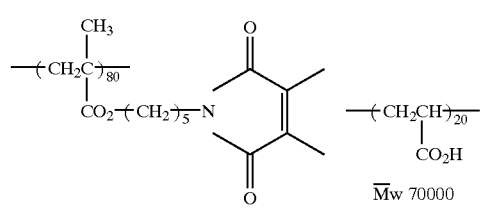
X-12
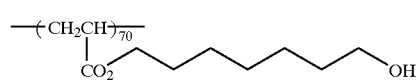
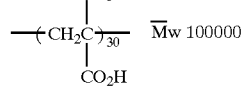
-continued
X-13
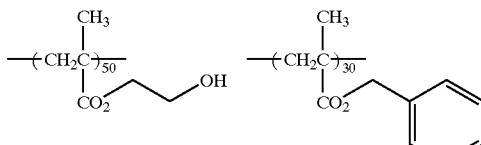
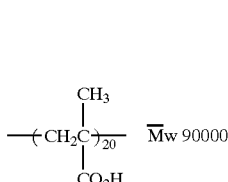
X-14
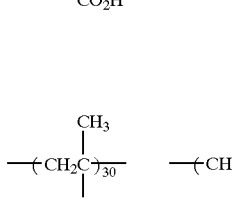
X-15
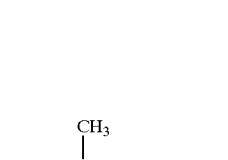
X-16
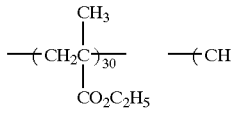
X-17
Y-1
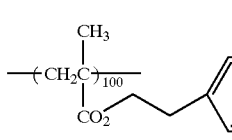

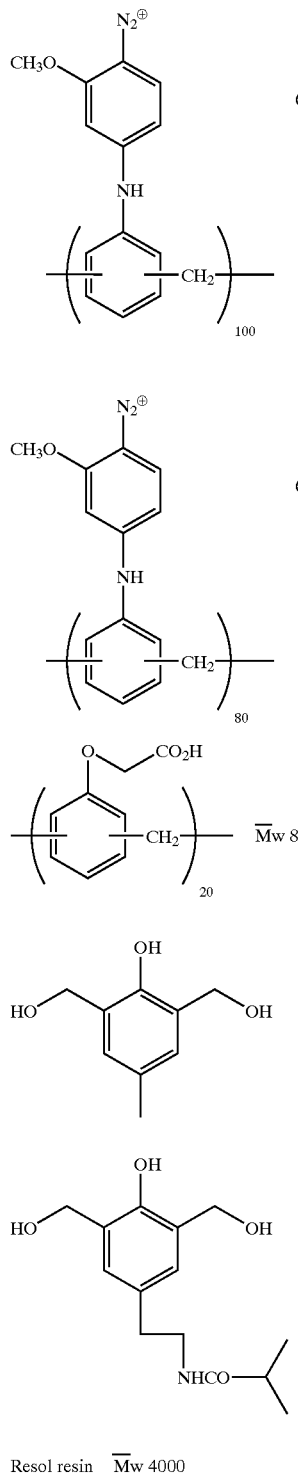
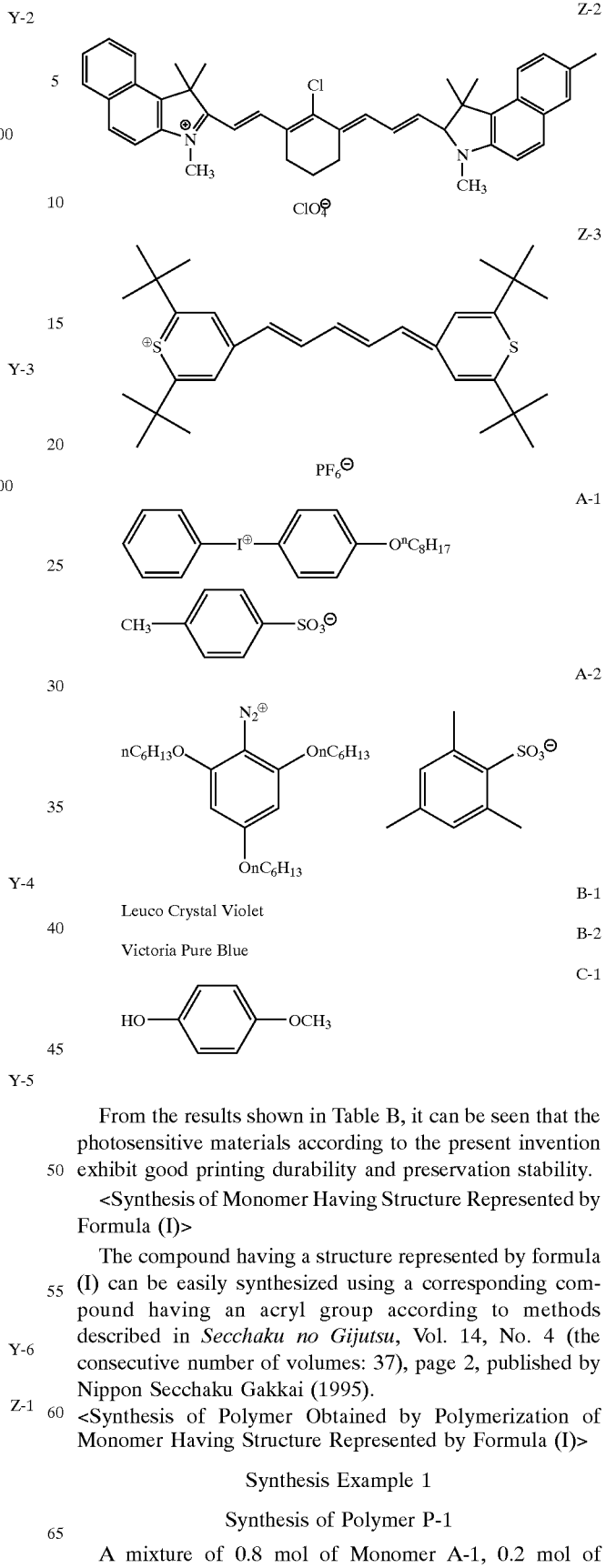

From the results shown in Table B, it can be seen that the photosensitive materials according to the present invention exhibit good printing durability and preservation stability.

<Synthesis of Monomer Having Structure Represented by Formula (I)>

The compound having a structure represented by formula (I) can be easily synthesized using a corresponding compound having an acryl group according to methods described in *Secchaku no Gijutsu*, Vol. 14, No. 4 (the consecutive number of volumes: 37), page 2, published by Nippon Secchaku Gakkai (1995).

<Synthesis of Polymer Obtained by Polymerization of Monomer Having Structure Represented by Formula (I)>

Synthesis Example 1

Synthesis of Polymer P-1

A mixture of 0.8 mol of Monomer A-1, 0.2 mol of methacrylic acid, 0,03 mol of azo thermal polymerization initiator (V-65, produced by Wako Pure Chemical Industries, Ltd.) and one liter of N,N-dimethylacetamide was stirred at 70° C. for 5 hours in a flask. After the completion of the reaction, the reaction mixture was added to 5 liters of water little by little with stirring to deposit white powder. The powder was collected by filtration and dried to obtain Polymer P-1 in a yield of 90%. The structure of the polymer was confirmed by NMR, IR and GPC.

Synthesis Example 2

Synthesis of Polymer P-8

A mixture of 0.6 mol of Monomer A-81, 0.4 mol of acrylic acid, 0.02 mol of azo thermal polymerization initiator (V-65, produced by Wako Pure Chemical Industries, Ltd.) and one liter of N,N-dimethylacetamide was stirred at 70° C. for 5 hours in a flask. After the completion of the reaction, the reaction mixture was added to 5 liters of water little by little with stirring to deposit white powder. The powder was collected by filtration and dried to obtain Polymer P-9 in a yield of 85%. The structure of the polymer was confirmed by NMR, IR and GPC.

Synthesis Example 3

Synthesis of Polymer P-16

A mixture of 0.5 mol of Monomer A-17, 0.3 mol of methacrylic acid, 0.2 mol of benzyl acrylate, 0.03 mol of azo thermal polymerization initiator (V-65, produced by Wako Pure Chemical Industries, Ltd.) and one liter of N,N-dimethylacetamide was stirred at 70° C. for 5 hours in a flask. After the completion of the reaction, the reaction mixture was added to 5 liters of water little by little with stirring to deposit white powder. The powder was collected by filtration and dried to obtain Polymer P-16 in a yield of 90%. The structure of the polymer was confirmed by NMR, IR and GPC.

Similarly, the polymers of specific examples set forth hereinbefore may be synthesized.

Examples 101 to 125 and Comparative Examples 101 to 125

(Preparation of Support)

A 0.3 mm-thick aluminum plate was etched by dipping it in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic graining treatment in a 1% by weight aqueous nitric acid solution using an alternating current with a sinusoidal waveform at electricity of 300 coulomb/dm$^2$ during the anodic time. Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to conduct a desmut treatment, and then subjected to an anodic oxidation treatment in a 20% by weight aqueous sulfuric acid solution for 2 minutes at a current density of 2 A/dm$^2$ to form an anodic oxide film having a thickness of 2.7 g/m$^2$. The surface roughness measured was 0.3 µm (the Ra value according to JIS B0601).

On the back surface of the thus-treated aluminum plate, a coating solution for backcoat layer described below was coated by a bar coater and dried at 100° C. for 1 minute, thereby preparing a support having provided thereon the backcoat layer having a dry coating amount of 70 mg//m$^2$.

| Sol-gel reaction solution | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and about 5 minutes later, heat generation occurred. After reacting the mixture for 60 minutes, a solution having the composition shown below was added the reaction mixture to prepare the coating solution for backcoat layer.

| | |
|---|---|
| Pyrogallol formaldehyde condensed resin (molecular weight: 2,000) | 4 parts by weight |
| Dimethyl phthalate | 5 parts by weight |
| Fluorine surface active agent (N-butylperfluorooctane sulfonamidoethyl acrylate/ polyoxyethylene acrylate copolymer, molecular weight: 20,000) | 0.7 parts by weight |
| Methanol silica sol (produced by Nissan Chemical Industries, Ltd., 30% by weight in methanol) | 50 parts by weight |
| Methanol | 800 parts by weight |

(Preparation of Photosensitive Layer)

On the above-described aluminum support, a coating solution for photosensitive layer having the composition shown below was coated and dried at 100° C. for 1 minute to form a photosensitive layer having a dry coating amount of 1.5 g/m$^2$, thereby preparing a photosensitive material.

| Solution for photosensitive layer | |
|---|---|
| Polymer (X) of the present invention or for comparison shown in Table C below | 2.0 g |
| Photopolymerization Initiator (Y) shown in Table C below | 0.3 g |
| Polymerizable compound (R) shown in Table C below | 2.5 g |
| Additive (S) shown in Table C below | 0.4 g |
| Fluorine surface active agent (Megafac F-177, produced by Dai-Nippon Ink & Chemicals, Inc.) | 0.03 g |
| Thermal polymerization inhibitor (N-nitrosophenylhydroxylamine aluminum salt) | 0.01 g |
| Pigment dispersion (shown below) | 2.0 g |
| Methyl Ethyl ketone | 20 g |
| Propylene glycol monomethyl ether | 20 g |
| Composition of Pigment Dispersion | |
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |

(Preparation of Protective Layer)

As shown in Table C below, in some examples, a 3% by weight aqueous solution of polyvinyl alcohol (saponification degree: 98% by mole, polymerization degree: 550) was coated on the photosensitive layer and dried at 100° C. for 2 minutes to prepare a protective layer having a dry coating weight of 2 g/m².

(Evaluation of Printing Durability)

Each photosensitive material was subjected to scanning exposure using a laser responding to the photosensitive material to form a 1% dot image (highlight), a heat treatment by a panel heater at 120° C. for 20 seconds and development with a developer shown below. The printing plate thus-obtained was subjected to printing using a printing machine (Hydel KOR-D) and a number of printed matters free from image degradation was determined. The number of printed matters for each printing plate was relatively compared using a printing durability index when the number of printed matters of Comparative Example 101 is taken as 100. The larger the index, the better the printing durability. The results obtained are shown in Table D below.

| Composition of developer | |
|---|---|
| DP-4 (produced by Fuji Photo Film Co., Ltd.) | 65.0 g |
| Water | 880.0 g |
| Lipomin LA (20% aqueous solution, produced by Lion Corp.) | 50.0 g |

(Evaluation of Preservation Stability)

Each of the photosensitive material before the laser exposure was allowed to stand under a high temperature condition (60° C.) for 3 days, and then subjected to the laser exposure in the same manner as above. The amount of energy necessary for imaging was determined and an energy ratio between before and after the preservation at a high temperature (energy after high temperature preservation/energy before high temperature preservation) was obtained. The energy ratio of not more than 1.1 is preferable in the production and denotes excellent preservation stability. The results obtained are also shown in Table D below.

TABLE C

| | Photosensitive Material | | | | Protective Layer | Exposure Light Source (nm) |
|---|---|---|---|---|---|---|
| | X | Y | R | S | | |
| Example | | | | | | |
| 101 | P-1 | Y-1 | R-1 | none | present | 400 |
| 102 | P-4 | Y-1 | R-1 | none | present | 400 |
| 103 | P-6 | Y-2 | R-2 | S-1 | present | 400 |
| 104 | P-8 | Y-2 | R-2 | none | present | 400 |
| 105 | P-9 | Y-1 | R-3 | S-3 | present | 400 |
| 106 | P-14 | Y-2 | R-3 | S-4 | present | 400 |
| 107 | P-17 | Y-2 | R-1 | S-2 | present | 400 |
| 108 | P-20 | Y-2 | R-1 | none | present | 400 |
| 109 | P-21 | Y-1 | R-2 | S-1 | present | 400 |
| Comparative Example | | | | | | |
| 101 | XP-1 | Y-1 | R-1 | none | present | 400 |
| 102 | XP-4 | Y-1 | R-1 | none | present | 400 |
| 103 | XP-6 | Y-2 | R-2 | S-1 | present | 400 |
| 104 | XP-8 | Y-2 | R-2 | none | present | 400 |
| 105 | XP-9 | Y-1 | R-3 | S-3 | present | 400 |
| 106 | XP-14 | Y-2 | R-3 | S-4 | present | 400 |
| 107 | XP-17 | Y-2 | R-1 | S-2 | present | 400 |
| 108 | XP-20 | Y-2 | R-1 | none | present | 400 |
| 109 | XP-21 | Y-1 | R-2 | S-1 | present | 400 |
| Example | | | | | | |
| 110 | P-1 | Y-3 | R-1 | none | present | 532 |
| 111 | P-4 | Y-3 | R-1 | none | present | 532 |
| 112 | P-6 | Y-4 | R-1 | S-1 | present | 532 |
| 113 | P-8 | Y-4 | R-3 | S-2 | present | 532 |
| 114 | P-9 | Y-5 | R-3 | S-3 | present | 532 |
| 115 | P-14 | Y-4 | R-3 | S-4 | present | 532 |
| 116 | P-17 | Y-4 | R-2 | S-2 | present | 532 |
| 117 | P-21 | Y-3 | R-2 | none | present | 532 |
| Comparative Example | | | | | | |
| 110 | XP-1 | Y-3 | R-1 | none | present | 532 |
| 111 | XP-4 | Y-3 | R-1 | none | present | 532 |
| 112 | XP-6 | Y-4 | R-1 | S-1 | present | 532 |
| 113 | XP-8 | Y-4 | R-3 | S-2 | present | 532 |
| 114 | XP-9 | Y-5 | R-3 | S-3 | present | 532 |
| 115 | XP-14 | Y-4 | R-3 | S-4 | present | 532 |
| 116 | XP-17 | Y-4 | R-2 | S-2 | present | 532 |
| 117 | XP-21 | Y-3 | R-2 | none | present | 532 |
| Example | | | | | | |
| 118 | P-1 | Y-5 | R-2 | none | none | 830 |
| 119 | P-4 | Y-6 | R-2 | none | none | 830 |
| 120 | P-6 | Y-6 | R-1 | S-5 | none | 830 |
| 121 | P-B | Y-7 | R-2 | S-5 | none | 830 |
| 122 | P-9 | Y-7 | R-2 | S-6 | none | 830 |
| 123 | P-14 | Y-8 | R-1 | S-7 | none | 830 |
| 124 | P-17 | Y-8 | R-2 | none | none | 830 |
| 125 | P-21 | Y-9 | R-2 | none | none | 830 |
| Comparative Example | | | | | | |
| 118 | XP-1 | Y-5 | R-2 | none | none | 830 |
| 119 | XP-4 | Y-6 | R-2 | none | none | 830 |
| 120 | XP-6 | Y-6 | R-1 | S-5 | none | 830 |
| 121 | XP-8 | Y-7 | R-2 | S-5 | none | 830 |
| 122 | XP-9 | Y-7 | R-2 | S-6 | none | 830 |
| 123 | XP-14 | Y-8 | R-1 | S-7 | none | 830 |
| 124 | XP-17 | Y-8 | R-2 | none | none | 830 |
| 125 | XP-21 | Y-9 | R-2 | none | none | 830 |

TABLE D

| Evaluation Result | | |
|---|---|---|
| Example | Printing Durability Index | Preservation Stability |
| 101 | 200 | 1.1 |
| 102 | 200 | 1.1 |
| 103 | 200 | 1.1 |
| 104 | 250 | 1.1 |
| 105 | 250 | 1.1 |
| 106 | 200 | 1.1 |
| 107 | 200 | 1.1 |
| 108 | 200 | 1.1 |
| 109 | 250 | 1.1 |
| Comparative Example | Printing Durability Index | Preservation Stability |

TABLE D-continued
Evaluation Result
| | | |
|---|---|---|
| 101 | 100 | 3.0 |
| 102 | 120 | 2.0 |
| 103 | 100 | 3.5 |
| 104 | 120 | 2.0 |
| 105 | 110 | 1.5 |
| 106 | 130 | 3.5 |
| 107 | 130 | 2.0 |
| 108 | 120 | 3.5 |
| 109 | 120 | 4.5 |
| Example | Printing Durability Index | Preservation Stability |
|---|---|---|
| 110 | 180 | 1.1 |
| 111 | 180 | 1.05 |
| 112 | 200 | 1.1 |
| 113 | 200 | 1.1 |
| 114 | 200 | 1.05 |
| 115 | 190 | 1.1 |
| 116 | 180 | 1.1 |
| 117 | 200 | 1.1 |
| Comparative Example | Printing Durability Index | Preservation Stability |
|---|---|---|
| 110 | 90 | 3.0 |
| 111 | 100 | 2.5 |
| 112 | 100 | 3.5 |
| 113 | 100 | 2.0 |
| 114 | 100 | 2.5 |
| 115 | 110 | 3.0 |
| 116 | 100 | 2.0 |
| 117 | 120 | 4.0 |
| Example | Printing Durability Index | Preservation Stability |
|---|---|---|
| 118 | 150 | 1.1 |
| 119 | 160 | 1.05 |
| 120 | 180 | 1.1 |
| 121 | 150 | 1.1 |
| 122 | 180 | 1.05 |
| 123 | 160 | 1.1 |
| 124 | 170 | 1.1 |
| 125 | 160 | 1.1 |
| Comparative Example | Printing Durability Index | Preservation Stability |
|---|---|---|
| 118 | 70 | 2.0 |
| 119 | 80 | 3.0 |
| 120 | 90 | 3.0 |
| 121 | 100 | 2.0 |
| 122 | 100 | 1.5 |
| 123 | 70 | 3.5 |
| 124 | 80 | 1.5 |
| 125 | 90 | 2.0 |
Compounds Described in Table C
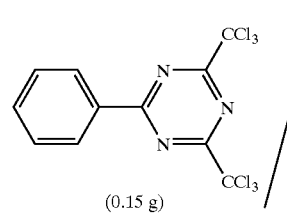
Y-1
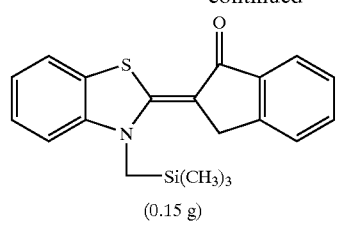
Y-2
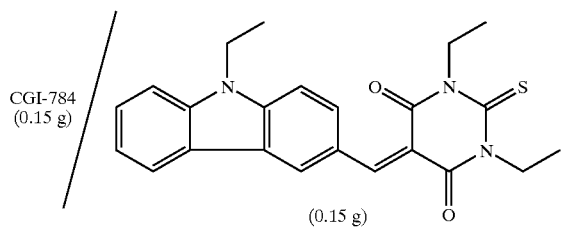
Y-3
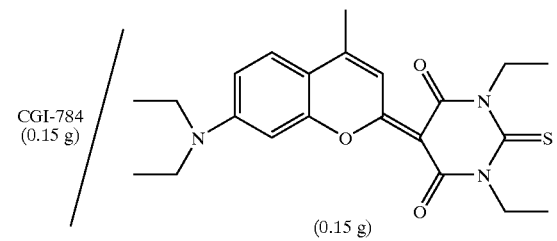
Y-4
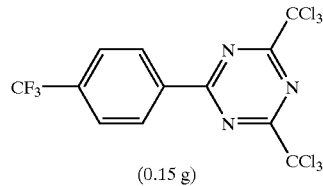
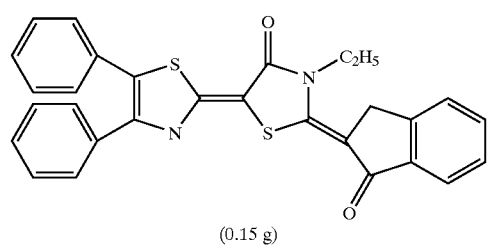
Y-5
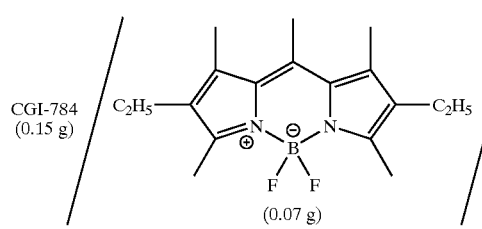

-continued
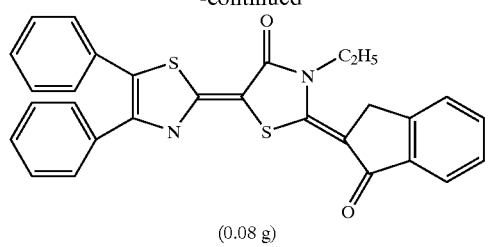
(0.08 g)
CGI-784 is a product of Ciba Geigy
R-1
Pentaerythritol tetraacrylate (ATMMT)
R-2
Dipentaerythritol hexaacrylate (DPHA)
R-3
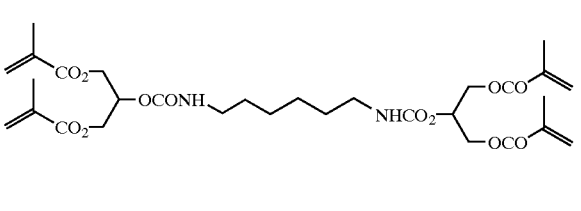
S-1
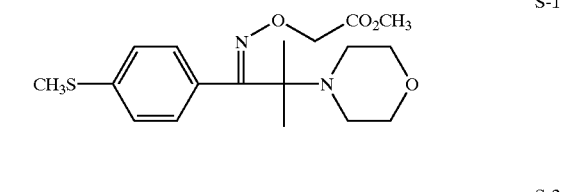
S-2
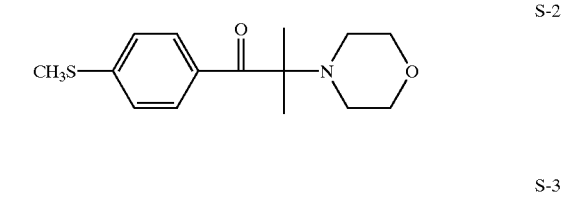
S-3
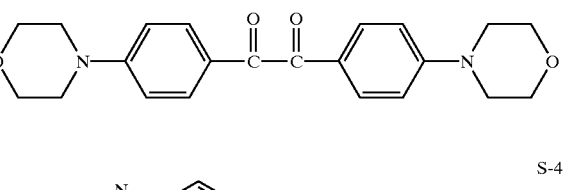
S-4
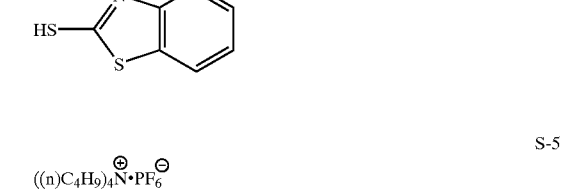
S-5
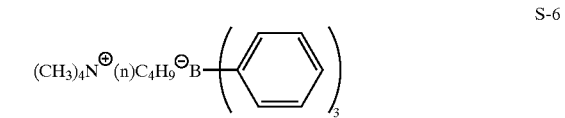
$((n)C_4H_9)_4\overset{\oplus}{N} \cdot PF_6^{\ominus}$
S-6
$(CH_3)_4\overset{\oplus}{N}{}^{(n)}C_4H_9\overset{\ominus}{B}\left(\phantom{xx}\right)_3$
-continued
S-7
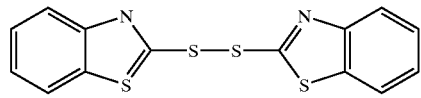
Y-6
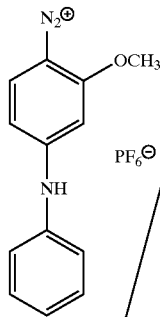
(0.15 g)
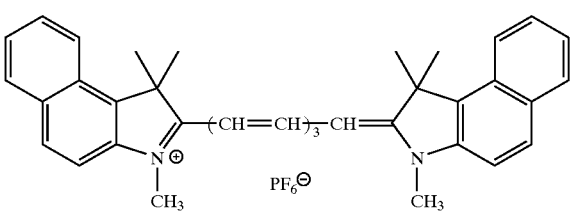
(0.15 g)
Y-7
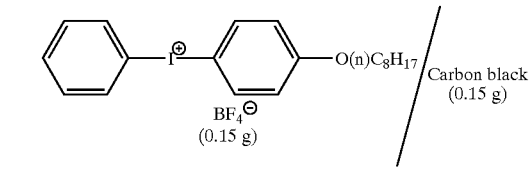 Carbon black (0.15 g)
Y-8
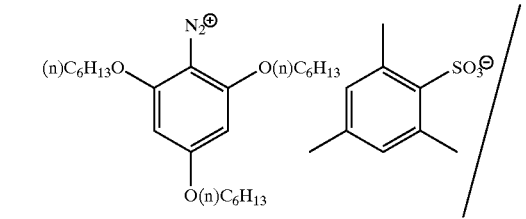
(0.15 g)
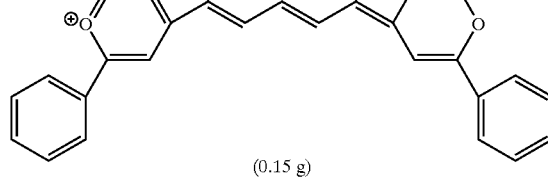
(0.15 g)

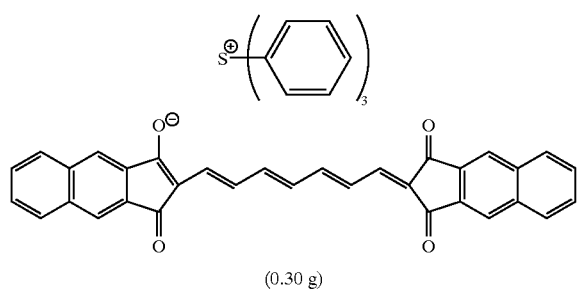

Polymers Used in Comparative Examples

From the results shown in Table D, it can be seen that the photosensitive materials according to the present invention exhibit good printing durability and preservation stability.

By using a polymer having the pendant α-hetero-substituted methyl groups on the main chain thereof as a binder, the photosensitive composition of the present invention is improved in the compatibility, efficiency of the crosslinking reaction at the time of exposure and film strength. A negative working lithographic printing plate having a photosensitive layer comprising the photosensitive composition of the present invention is suitable for a lithographic printing plate precursor capable of performing direct plate-making based on digital data, for example, from a computer by recording with a laser radiating an ultraviolet ray, visible light or infrared ray. The lithographic printing plate precursor exhibits high film strength in the image area of photosensitive layer and is excellent in printing durability and preservation stability. The photosensitive composition according to the present invention has the extremely high practicality.

Further, according to the present invention, a photosensitive composition excellent in film strength of a photosensitive layer and preservation stability can be provided, as a photo-radical polymerization composition that is promising in image forming techniques due to the highest sensitivity. Particularly, a photosensitive composition suitable for a lithographic printing plate precursor capable of performing direct plate-making based on digital data, for example, from a computer by recording with a solid laser or semiconductor laser which emits an ultraviolet ray, visible light or an infrared ray can be provided. The lithographic printing plate precursor is excellent in printing durability of photosensitive layer and preservation stability.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A negative working photosensitive composition comprising a resin containing a repeating unit corresponding to a monomer having a structure represented by the following formula (I):

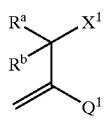

(I)

wherein $Q^1$ represents a cyano group (CN) or a group represented by $COX^2$; $X^1$ and $X^2$ each represents a halogen atom or a group connected through a hetero atom; $R^a$ and $R^b$, which may be the same or different, each represents a hydrogen atom, a halogen atom, a cyano group or an organic residue; or $X^1$ and $X^2$, $R^a$ and $R^b$ or $X^1$ and $R^a$ or $R^b$ may combine with each other to form a cyclic structure.

2. The negative working photosensitive composition as claimed in claim 1, wherein $X^1$ represents a halogen atom, a hydroxy group, a substituted oxy group, a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group or a heterocyclic group that is connected through a hetero atom included therein.

3. The negative working photosensitive composition as claimed in claim 1, wherein $X^2$ represents a halogen atom, a hydroxy group, a substituted oxy group, a mercapto group, a substituted thio group, an amino group, a substituted amino group or a heterocyclic group that is connected through a hetero atom included therein.

4. The negative working photosensitive composition as claimed in claim 1, wherein $R^a$ and $R^b$, which may be the same or different, each represents a hydrogen atom, a halogen atom, a cyano group, a hydrocarbon group which may have a substituent and/or an unsaturated bond, a substituted oxy group, a substituted thio group, a substituted amino group, a substituted carbonyl group or a carboxylato group.

5. The negative working photosensitive composition as claimed in claim 1, wherein the resin further contains a repeating unit corresponding to a monomer selected from an acrylate, a methacrylate, an acrylamide, a methacrylamide, a vinyl ester, a styrene, acrylic acid, methacrylic acid and acrylonitrile.

6. The negative working photosensitive composition as claimed in claim 1, wherein the resin is a random polymer.

7. The negative working photosensitive composition as claimed in claim 1, wherein the resin has a maleimido photo-crosslinkable group.

8. The negative working photosensitive composition as claimed in claim 1, wherein the resin has a reactive side chain causing photo-crosslinking with a diazo resin.

9. The negative working photosensitive composition as claimed in claim 1, wherein the resin has a reactive side chain causing acid-crosslinking with a methylol compound.

10. The negative working photosensitive composition as claimed in claim 1 further comprising a photosensitizer.

11. The negative working photosensitive composition as claimed in claim 1 further comprising an acid generator.

12. The negative working photosensitive composition as claimed in claim 1 further comprising an infrared absorbing dye.

13. A negative working lithographic printing plate having a negative working photosensitive layer comprising the negative working photosensitive composition as claimed in claim 1.

14. The negative working lithographic printing plate as claimed in claim 13, which is capable of forming an image by laser exposure.

15. A negative working photosensitive composition comprising a resin containing a repeating unit corresponding to a monomer having a structure represented by formula (I) shown below and a polymerizable compound having an unsaturated double bond:

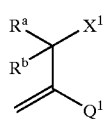

(I)

wherein $Q^1$ represents a cyano group (CN) or a group represented by $COX^2$; $X^1$ and $X^2$ each represents a halogen atom or a group connected through a hetero atom; $R^a$ and $R^b$, which may be the same or different, each represents a hydrogen atom, a halogen atom, a cyano group or an organic residue; or $X^1$ and $X^2$, $R^a$ and $R^b$ or $X^1$ and $R^a$ or $R^b$ may combine with each other to form a cyclic structure.

16. The negative working photosensitive composition as claimed in claim 15 further comprising an infrared absorbing dye.

17. A negative working lithographic printing plate having a negative working photosensitive layer comprising the negative working photosensitive composition as claimed in claim 15.

18. The negative working lithographic printing plate as claimed in claim 17, which is capable of forming an image by laser exposure.

* * * * *